United States Patent
Ono et al.

(10) Patent No.: US 9,324,880 B2
(45) Date of Patent: Apr. 26, 2016

(54) THIN FILM TRANSISTOR AND METHOD OF PRODUCING THE SAME, DISPLAY DEVICE, IMAGE SENSOR, X-RAY SENSOR, AND X-RAY DIGITAL IMAGING DEVICE

(71) Applicant: FUJIFILM CORPORATION, Minato-ku, Tokyo (JP)

(72) Inventors: Masashi Ono, Kanagawa (JP); Masahiro Takata, Kanagawa (JP); Atsushi Tanaka, Kanagawa (JP); Masayuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/175,482

(22) Filed: Feb. 7, 2014

(65) Prior Publication Data

US 2014/0231798 A1 Aug. 21, 2014

Related U.S. Application Data

(63) Continuation of application No. PCT/JP2012/067508, filed on Jul. 9, 2012.

(30) Foreign Application Priority Data

Aug. 12, 2011 (JP) .................. 2011-177235

(51) Int. Cl.
*H01L 29/10* (2006.01)
*H01L 29/12* (2006.01)
(Continued)

(52) U.S. Cl.
CPC .... *H01L 29/78693* (2013.01); *H01L 21/02422* (2013.01); *H01L 21/02472* (2013.01);
(Continued)

(58) Field of Classification Search
CPC ................ H01L 21/02422; H01L 21/02565; H01L 21/02554; H01L 21/02631; H01L 27/14658; H01L 29/7869; H01L 27/3234; H01L 27/14659; H01L 27/3262
See application file for complete search history.

(56) References Cited

U.S. PATENT DOCUMENTS

| | | | | |
|---|---|---|---|---|
| 4,283,753 A | * | 8/1981 | Burn | ................... C04B 35/4682 252/519.54 |
| 2010/0097838 A1 | * | 4/2010 | Tanaka | ................. G11C 13/047 365/112 |

(Continued)

FOREIGN PATENT DOCUMENTS

| JP | 2009-170905 A | 7/2009 |
|---|---|---|
| JP | 2010-21333 A | 1/2010 |

(Continued)

OTHER PUBLICATIONS

Nomura, Kenji, et al. "Room-temperature fabrication of transparent flexible thin-film transistors using amorphous oxide semiconductors." Nature 432.7016 (2004): 488-492.*

(Continued)

*Primary Examiner* — Jarrett Stark
(74) *Attorney, Agent, or Firm* — Sughrue Mion, PLLC

(57) ABSTRACT

A thin film transistor includes a gate electrode; a gate insulating film which contacts the gate electrode; an oxide semiconductor layer which includes a first region represented by In(a)Ga(b)Zn(c)O(d), wherein $0<a\leq 37/60$, $3a/7-3/14\leq b\leq 91a/74-17/40$, $b>0$, $0<c\leq 3/5$, $a+b+c=1$, and $d>0$, and a second region represented by In(p)Ga(q)Zn(r)O(s), wherein $q/(p+q)>0.250$, $p>0$, $q>0$, $r>0$, and $s>0$, and located farther than the first region with respect to the gate electrode and which is arranged facing the gate electrode with the gate insulating film provided therebetween. A source electrode and a drain electrode are arranged so as to be apart from each other and are capable of being electrically conducted through the oxide semiconductor layer.

15 Claims, 11 Drawing Sheets

(51) Int. Cl.
| | |
|---|---|
| *H01L 29/786* | (2006.01) |
| *H01L 27/146* | (2006.01) |
| *H01L 21/02* | (2006.01) |
| *H05B 33/10* | (2006.01) |
| *H05B 33/26* | (2006.01) |
| *H01L 29/66* | (2006.01) |
| *H01L 27/32* | (2006.01) |

(52) U.S. Cl.
CPC .... *H01L21/02483* (2013.01); *H01L 21/02554* (2013.01); *H01L 21/02565* (2013.01); *H01L 21/02631* (2013.01); *H01L 27/14658* (2013.01); *H01L 29/66969* (2013.01); *H01L 29/7869* (2013.01); *H05B 33/10* (2013.01); *H05B 33/26* (2013.01); *H01L 27/14659* (2013.01); *H01L 27/3234* (2013.01); *H01L 27/3262* (2013.01)

(56) References Cited

U.S. PATENT DOCUMENTS

| | | | | |
|---|---|---|---|---|
| 2010/0320458 | A1* | 12/2010 | Umeda | C01G 15/006 257/43 |
| 2010/0320459 | A1 | 12/2010 | Umeda et al. | |
| 2011/0140100 | A1 | 6/2011 | Takata et al. | |
| 2013/0328045 | A1* | 12/2013 | Takata | H01L 29/66969 257/43 |
| 2014/0131696 | A1* | 5/2014 | Ono | H01L 29/7869 257/40 |

FOREIGN PATENT DOCUMENTS

| | | | |
|---|---|---|---|
| JP | 2010-21555 | A | 1/2010 |
| JP | 2010-73881 | A | 4/2010 |
| JP | 2010-161339 | A | 7/2010 |
| JP | 2011-3856 | A | 1/2011 |
| JP | 2011-103402 | A | 5/2011 |
| JP | 2011-124360 | A | 6/2011 |

OTHER PUBLICATIONS

Iwasaki, Tatsuya, et al. "Combinatorial approach to thin-film transistors using multicomponent semiconductor channels: An application to amorphous oxide semiconductors in In-Ga-Zn-O system." Applied physics letters 90.24 (2007): 242114.*

Office Action of Japanese Patent Application No. 2011-177235, dated Nov. 29, 2011, 6 pages in Japanese and English.

International Search Report in PCT/JP12/067508, dated Oct. 2, 2012, 5 pages in Japanese and English.

Written Opinion in PCT/JP12/067508, dated Oct. 2, 2012, 10 pages in Japanese and English.

Examination Report, dated Sep. 16, 2015, issued in Korean Application No. 10-2014-7003188, 10 pages in English and Korean.

Communication dated Dec. 21, 2015 from the Taiwanese Intellectual Property Office issued in corresponding Application No. 101127289.

Communication dated Jan. 22, 2016, issued by the State Intellectual Property Office of the P.R.C. in corresponding Chinese Application No. 201280038731.4.

Communication dated Feb. 17, 2016, issued by the Korean Intellectual Property Office in corresponding Korean Application No. 10-2014-7003188.

* cited by examiner

FIG. 5

(A) As-depo

Ga/(In+Ga) = 0.75
Ga/(In+Ga) = 0.25
Ga/(In+Ga) = 0.75
Ga/(In+Ga) = 0.25
Ga/(In+Ga) = 0.75

(B) HEAT TREATMENT AT 600°C

THIN FILM TRANSISTOR AND METHOD OF PRODUCING THE SAME, DISPLAY DEVICE, IMAGE SENSOR, X-RAY SENSOR, AND X-RAY DIGITAL IMAGING DEVICE

CROSS-REFERENCE TO RELATED APPLICATIONS

This application is a continuation application of International Application No. PCT/JP2012/067508, filed Jul. 9, 2012, the disclosure of which is incorporated herein by reference in its entirety. Further, this application claims priority from Japanese Patent Application No. 2011-177235, filed Aug. 12, 2011, the disclosure of which is incorporated herein by reference in its entirety.

TECHNICAL FIELD

The present invention relates to a thin film transistor and a method of producing the same, a display device, an image sensor, an X-ray sensor, and an X-ray digital imaging device.

BACKGROUND ART

Recently, a thin film transistor using an In—Ga—Zn—O-based (hereinafter referred to as IGZO) oxide semiconductor thin film in an active layer (channel layer) has been actively researched and developed. The oxide semiconductor thin film can be formed at a low temperature, exhibits higher mobility than that of amorphous silicon, and is transparent to visible light, and therefore, a flexible thin film transistor can be formed on a substrate such as a plastic sheet or a film.

Here, a comparison of various transistor characteristics such as field-effect mobility, process temperature and the like is shown in Table 1.

TABLE 1

| | LTPS low-temperature polysilicon | a-Si:H | μC-Si:H | Organic-TFT | Oxide-TFT |
|---|---|---|---|---|---|
| Mobility | 100 | <1 | 2-3 | <1-5 | 3-50 |
| Stability$\Delta V_{TH}$ | <1 | 100 | 1-2 | 30 | 1-2 |
| Uniformity | Δ | ○ | ○? | Δ | ○? |
| Film-formation temperature | 450 | 300 | 300 | RT-100 | RT-350 |

As shown in Table 1, although a thin film transistor in which an active layer is made from polysilicon is capable of having a mobility of approximately 100 cm$^2$/Vs, since the process temperature is 450° C. or more and thus is very high, the thin film transistor can be formed only on a highly heat-resistant substrate and is not suitable for reduction in cost, increase in area, and flexibilization. Further, since a thin film transistor in which an active layer is made from amorphous silicon can be formed at a relatively low temperature of approximately 300° C., the selectivity of a substrate is greater than that of polysilicon; however, only a mobility of approximately at most 1 cm$^2$/Vs is obtained, and thus, the thin film transistor is unsuitable for high-definition display application. In contrast, in terms of low temperature film formation, since a thin film transistor in which an active layer is made from an organic material can be formed at a temperature of 100° C. or less, the thin film transistor is expected to be applied to flexible display applications using a plastic film substrate having a low heat resistance; however, the thin film transistor can obtain only a mobility equivalent to that of amorphous silicon.

For example, Japanese Patent Application Laid-Open (JP-A) No. 2010-21555 discloses a thin film transistor in which a high mobility layer containing an oxide of IZO, ITO, GZO, or AZO is disposed as an active layer on a side close to a gate electrode, and an oxide layer containing Zn is disposed on a side far from the gate electrode.

Japanese Patent Application Laid-Open (JP-A) No. 2009-170905 discloses a display substrate including a first semiconductor pattern containing at least amorphous silicon on a gate wiring and a second semiconductor pattern containing at least one of elements selected from Ga, In, Zn, Sn, Co, Ti, and Mg and an oxide element O.

Japanese Patent Application Laid-Open (JP-A) No. 2010-161339 discloses a field-effect type transistor including at least a semiconductor layer and a gate electrode provided facing the semiconductor layer with a gate insulating layer provided therebetween, in which the semiconductor layer includes a first amorphous oxide semiconductor layer containing at least one element selected from Zn or In and a second amorphous oxide semiconductor layer containing at least one element selected from Ge or Si, and at least one element selected from Zn or In.

Further, K. Koike et al., Applied Physics Letters, 87 (2005) 112106 discloses a heterostructure field-effect transistor in which a carrier transit layer is formed into a single quantum well by joining ZnO and ZnMgO having different electron affinities.

SUMMARY OF INVENTION

Technical Problem

In the thin film transistor disclosed in JP-A No. 2010-21555, an off-current value is high, and power consumption during standby (Vg=0 V) is large. Since IZO type and the like is used as a current path layer, characteristic deterioration with respect to voltage application at the time of driving is large, compared to a case of using an IGZO type.

In the display substrate disclosed in JP-A No. 2009-170905, since amorphous silicon in which the number of digits of the mobility is lower by approximately one, compared to that of an oxide semiconductor, is used as a carrier transit layer which is a quantum well portion, sufficient mobility cannot be obtained.

In the thin film transistor disclosed in JP-A No. 2010-161339, there is a case in which the off-current value might be increased, and thus, the thin film transistor is insufficient to realize low power consumption.

Further, in K. Koike et al., Applied Physics Letters, 87 (2005) 112106, in order to obtain high mobility, the heterostructure field-effect transistor (HEMT) is produced by epitaxial growth using a molecular beam epitaxy method (MBE method), and lattice mismatch between a substrate and a semiconductor film layer needs to be extremely reduced. Thus, the substrate needs to be heated at a temperature of more than 700° C., and the selectivity of a base material is extremely lowered.

That is, it has been difficult to simultaneously realize high mobility (for example, 30 cm$^2$/Vs) and normally-off, at low temperature (for example, 400° C. or less).

An object of the invention is to provide a thin film transistor which can be produced at 400° C. or less and simultaneously realizes a high field-effect mobility of 20 cm$^2$/Vs or more and a low off-current for realizing normally-off and a method of producing the same, a display device, an image sensor, an X-ray sensor, and an X-ray digital imaging apparatus, each of which exhibits favorable characteristics with low power consumption.

Solution to Problem

In order to achieve the above object, the following invention is provided.

<1> A thin film transistor comprising:
a gate electrode;
a gate insulating film which contacts the gate electrode;
an oxide semiconductor layer which includes a first region represented by In(a) Ga(b) Zn(c) O(d), wherein $0<a\leq 37/60$, $3a/7-3/14\leq b\leq 91a/74-17/40$, $b>0$, $0<c\leq 3/5$, $a+b+c=1$, and $d>0$, and a second region represented by In(p) Ga(q) Zn(r) O(s), wherein $q/(p+q)>0.250$, $p>0$, $q>0$, $r>0$, and $s>0$, and located farther than the first region with respect to the gate electrode, and which is arranged facing the gate electrode with the gate insulating film provided therebetween; and,
a source electrode and a drain electrode which are arranged so as to be apart from each other and are capable of being electrically conducted through the oxide semiconductor layer.

<2> The thin film transistor according to <1>, wherein the first region is in a composition range represented by $b\leq 17a/23-28/115$, $b\leq -9a+28/5$, $b\leq 3a/7-3/14$, and $c\leq 3/5$.

<3> The thin film transistor according to <1>, wherein the first region is in a composition range represented by $b\leq 17a/23-28/115$, $b\leq -9a+28/5$, and $b\geq 3a/37$.

<4> The thin film transistor according to any one of <1> to <3>, wherein the second region is represented by $q/(p+q)\leq 0.875$.

<5> The thin film transistor according to any one of <1> to <4>, wherein a film thickness of the second region is more than 10 nm and less than 70 nm.

<6> The thin film transistor according to any one of <1> to <5>, wherein the oxide semiconductor layer is amorphous.

<7> The thin film transistor according to any one of <1> to <6>, wherein the thin film transistor is a bottom gate-top contact type or a top gate-bottom contact type.

<8> A method of producing the thin film transistor according to any one of <1> to <7>, the method comprising:
a process of forming the first region that forms a part of the oxide semiconductor layer by sputtering when an inside of a film-formation chamber is at a first ratio of oxygen partial pressure/argon partial pressure; and,
a process of forming the second region that forms a part of the oxide semiconductor layer by sputtering when the inside of the film-formation chamber is at a second ratio of oxygen partial pressure/argon partial pressure.

<9> A method of producing the thin film transistor according to any one of <1> to <7>, the method comprising:
a process of forming the first region by sputtering;
a process of forming the second region by sputtering; and,
a process of irradiating a surface of the first region thus formed with oxygen radicals during and/or after the forming of the first region.

<10> A method of producing the thin film transistor according to any one of <1> to <7>, the method comprising:
a process of forming the first region by sputtering;
a process of forming the second region by sputtering; and,
a process of irradiating a surface of the first region thus formed with ultraviolet light in an ozone atmosphere during and/or after the forming of the first region.

<11> The method of producing a thin film transistor according to any one of <8> to <10>, wherein the oxide semiconductor layer is not exposed to the atmospheric air between the process of forming the first region and the process of forming the second region.

<12> The method of producing a thin film transistor according to any one of <8> to <11>, wherein a post anneal treatment is performed at a temperature of 300° C. or more after the formation of the first region and the second region.

<13> The method of producing a thin film transistor according to <8>, wherein the first ratio of oxygen partial pressure/argon partial pressure is higher than the second ratio of oxygen partial pressure/argon partial pressure.

<14> A display device comprising the thin film transistor according to any one of <1> to <7>.

<15> An image sensor comprising the thin film transistor according to any one of <1> to <7>.

<16> An X-ray sensor comprising the thin film transistor according to any one of <1> to <7>.

<17> An X-ray digital imaging device comprising the X-ray sensor according to <16>.

<18> The X-ray digital imaging device according to <17> capable of imaging a moving image.

Advantageous Effects of Invention

According to the invention, there can be provided a thin film transistor which can be produced at 400° C. or less and simultaneously realizes a high field-effect mobility of 20 $cm^2/Vs$ or more and a low off-current for realizing normally-off and a method of producing the same, a display device, an image sensor, an X-ray sensor, and an X-ray digital imaging apparatus, each of which exhibits good characteristics with low power consumption.

BRIEF DESCRIPTION OF DRAWINGS

FIG. 5 is a cross-sectional STEM image showing an IGZO layered film (A) immediately after stacking and a cross-sectional STEM image showing an IGZO layered film (B) after anneal treatment at 600° C.

DESCRIPTION OF EMBODIMENTS

Figure 1:
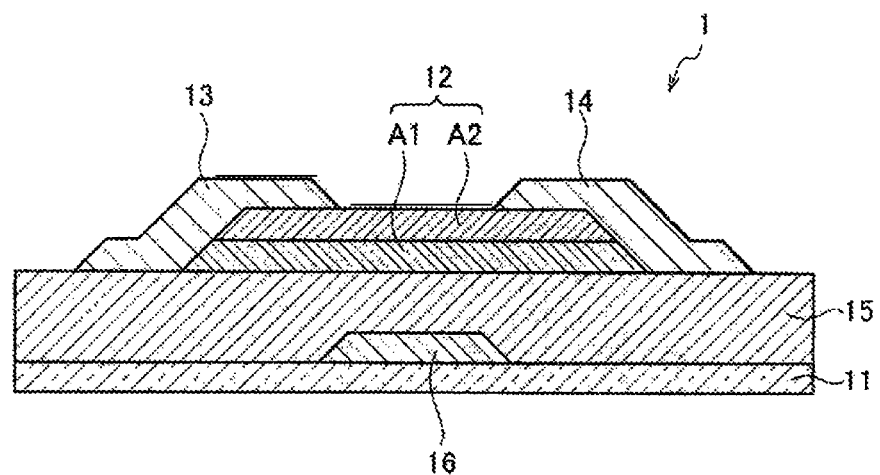
FIG. 1 is a schematic view showing a configuration of one example of a thin film transistor (bottom gate-top contact type) according to the invention.

Hereinafter, a thin film transistor and a method of producing the same, according to one embodiment of the invention, a display device, a sensor, and an X-ray sensor (digital imaging device), provided with the thin film transistor according to an embodiment of the invention are specifically described with reference to the accompanying drawings. In the drawings, members (constituent elements) having the same or corresponding functions are denoted by the same reference numeral, and description is arbitrarily omitted.

<Thin Film Transistor>

A thin film transistor (suitably referred to as "TFT") according to the invention has a function of applying a voltage to a gate electrode to control a current flowing in an oxide semiconductor layer, thereby switching a current in between a source electrode and a drain electrode, and has the gate electrode, a gate insulating film which contacts the gate electrode, an oxide semiconductor layer which includes a first region represented by In(a) Ga(b) Zn(c) O(d), wherein $0<a\leq37/60$, $3a/7-3/14\leq b\leq91a/74-17/40$, $b>0$, $0<c\leq3/5$, $a+b+c=1$, and $d>0$, and wherein a, b, and c correspond to a cation composition and d corresponds to a molar ratio of oxygen to cation composition to form oxide formed from zinc oxide, gallium oxie and zinc oxide, and a second region represented by In(p) Ga(q) Zn(r) O(s), wherein $q/(p+q)>0.250$, $p>0$, $q>0$, $r>0$, and $s>0$ and located farther than the first region with respect to the gate electrode, and which is arranged facing the gate electrode with the gate insulating film provided therebetween, and a source electrode and a drain electrode which are arranged so as to be apart from each other and are capable of being electrically conducted through the oxide semiconductor layer.

The thin film transistor according to the invention has a high field-effect mobility of 20 cm²/Vs or more and a low off-current realizing the thin film transistor normally-off (preferably, an off-current of 1E−9A or less) and can particularly achieve a mobility of 30 cm²/Vs or more and normally-off.

In the device structure of the thin film transistor according to the invention, since a carrier transit layer (first region) is not exposed to atmospheric air, deterioration in device characteristic depending on the elapse of time and a drive environment is reduced. An oxide semiconductor system which has the same base material such as In, Ga, or Zn are joined, whereby a joint interface is improved compared to a device when a heterogeneous semiconductor is joined, and device deterioration against electrical stress or the like at the time of driving is suppressed. When the thin film transistor is compared to a conventional TFT having a single-IGZO film, the driving stability is improved.

In the invention, the TFT may be formed on a substrate, or when a constituent element of TFT (for example, an electrode) serves as a substrate, an alternate substrate may be omitted. The TFT and the substrate may be directly in contact with each other, or an additional layer or an additional element may be provided between the TFT and the substrate.

The device structure of the TFT according to the invention may be any of aspects of a so-called bottom gate type (also called an inverse stagger structure) and a top gate type (also called a stagger structure), based on a position of the gate electrode. The device structure of the TFT according to the invention may be any of aspects of a so-called top contact type and a bottom contact type, based on a contact portion between an oxide semiconductor layer and a source electrode and a drain electrode (suitably referred to as "source and drain electrodes").

The top gate type is a form in which a gate electrode is provided at an upper side of a gate insulating film, and an active layer is formed at a lower side of the gate insulating film, and the bottom gate type is a form in which a gate electrode is provided at a lower side of a gate insulating film, and an active layer is formed at an upper side of the gate insulating film, when a substrate formed with a TFT thereon is a lowermost layer. The bottom contact type is a form in which the source and drain electrodes are formed prior to the active layer, and a lower surface of the active layer contacts the source and drain electrodes, and the top contact type is a form in which the active layer is formed prior to the source and drain electrodes, and an upper surface of the active layer contacts the source and drain electrodes.

The TFT according to one embodiment in the invention can have various configurations besides the above configurations and may be suitably provided with, for example, a protective layer on the active layer, an insulating layer on the substrate, or the like.

Hereinafter, one embodiment according to the invention is described with reference to the drawings. As a representative example, a TFT shown in FIGS. 1 and 2 is specifically described, however, the invention can be applied to TFTs having different embodiments (configurations).

Figure 2:
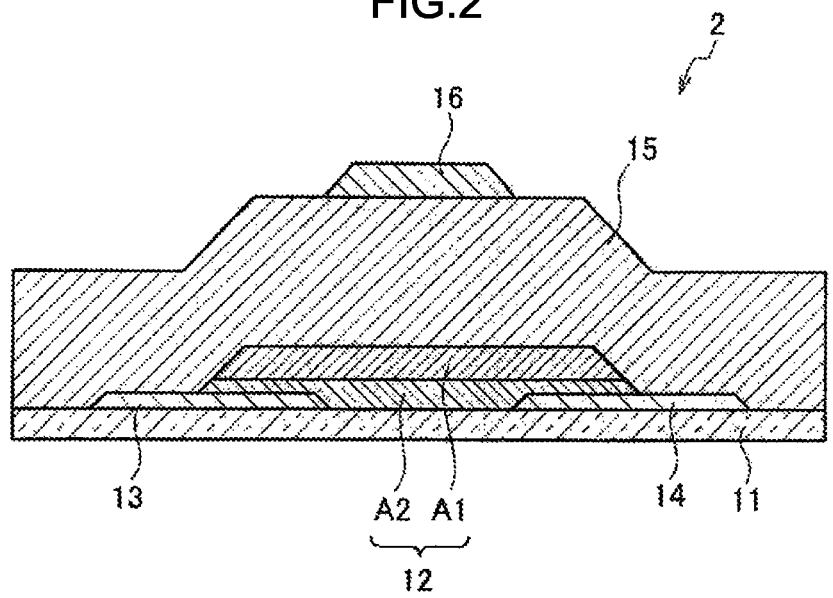
FIG. 2 is a schematic view showing a configuration of one example of a thin film transistor (top gate-bottom contact type) according to the invention.

FIG. 1 is a cross-sectional view schematically showing a configuration of a thin film transistor 1 according to a first embodiment according to the invention, and FIG. 2 is a cross-sectional view schematically showing a configuration of a thin film transistor 2 according to a second embodiment according to the invention. In each of the thin film transistors 1 and 2 of FIGS. 1 and 2, the common elements are denoted by the same reference symbols.

The thin film transistor 1 according to the first embodiment shown in FIG. 1 is a bottom gate-top contact type transistor, and the thin film transistor 2 according to the second embodiment shown in FIG. 2 is a top gate-bottom contact type transistor. Although embodiments shown in FIGS. 1 and 2 are different in arrangement of a gate electrode 16, a source electrode 13, and a drain electrode 14, with respect to an oxide semiconductor layer 12, the functions of each of the elements denoted by the same reference symbols are the same, and the same material can be used.

The thin film transistors 1 and 2 according to one embodiment according to the invention has, on a substrate 11, the gate electrode 16, a gate insulating film 15, the oxide semiconductor layer 12 (active layer), the source electrode 13, and the drain electrode 14, and the oxide semiconductor layer 12 includes, from a side closer to the gate electrode 16 in the film thickness direction, a first region A1 and a second region A2, in this order. The first region A1 and the second region A2 which form the oxide semiconductor layer 12 are formed continuously, and any layer other than an insulating layer or an oxide semiconductor layer such as an electrode layer or the like is not inserted between the first region A1 and the second region A2, and the first region A1 and the second region A2 are formed from an oxide semiconductor film.

Hereinafter, each of the constituent elements of the TFT according to the invention including a substrate with the TFT formed thereon is described in detail.

(Substrate)

The shape, structure, size and the like of the substrate 11 on which a thin film transistor is to be formed are not particularly limited and a substrate can be suitably selected depending on the purpose. The substrate 11 may have a single layer structure or a layered structure.

For example, a substrate formed from an inorganic material such as glass and YSZ (yttrium-stabilized zirconia), a resin, and a resin composite material and the like may be used. Among them, a substrate is preferably formed from a resin or a resin composite material, in terms of light weight and flexibility. Specific examples of the substrate include a substrate formed from a synthetic resin such as: polybutylene terephthalate, polyethylene terephthalate, polyethylene naphthalate, polybutylene naphthalate, polystyrene, polycarbonate, polysulfone, polyether sulfone, polyarylate, allyl diglycol carbonate, polyamide, polyimide, polyamide-imide, polyetherimide, polybenzazole, polyphenylene sulfide, polycycloolefin, a norbornene resin, a fluorine resin such as polychlorotrifluoroethylene, a liquid crystal polymer, an acrylic resin, an epoxy resin, a silicone resin, an ionomer resin, a cyanate resin, a crosslinked fumaric acid diester, cyclic polyolefin, aromatic ether, maleimide olefin, cellulose, and an episulfide compound.

A substrate formed from a composite plastic material of the above synthetic resin or the like and oxide silicon particles, a substrate formed from a composite plastic material of the above synthetic resin or the like and metal nanoparticles, inorganic oxide nanoparticles, inorganic nitride nanoparticles, or the like, a substrate formed from a composite plastic material of the above synthetic resin or the like and a carbon fiber or a carbon nanotube, a substrate formed from a composite plastic material of the above synthetic resin or the like and glass flakes, glass fibers, or glass beads, a substrate formed from a composite plastic material of the above synthetic resin or the like and clay mineral or particles having a crystal structure derived from mica, a layered layer-plastic substrate having at least one joint interface between thin glass and any of the above synthetic resins, a substrate which is formed from a composite material having a barrier property and which has at least one or more joint interfaces by alternately stacking an inorganic layer and an organic layer (the above synthetic resin), a metal multilayer substrate in which a stainless substrate or stainless and dissimilar metal are layered, and an aluminum substrate with an oxide film in which the aluminum substrate or the surface is subjected to an oxidation treatment (for example, anodization treatment) to improve the insulation properties of the surface, may be used.

A resin substrate is preferably excellent in heat resistance, dimension stability, solvent resistance, electrical insulation properties, processability, low gas permeability, low hygroscopicity and the like. The resin substrate may be provided with a gas barrier layer to prevent transmission of moisture and oxygen, an under coat layer to enhance the flatness of the resin substrate and adhesiveness with a lower electrode, or the like.

The thickness of the substrate 11 in a case of using a flexible substrate is preferably from 50 µm to 500 µm. When the thickness of the substrate 11 is 50 µm or more, the flatness of the substrate itself is further enhanced. When the thickness of the substrate 11 is 500 µm or less, the flexibility of the substrate itself is further enhanced, and the use of the substrate as a substrate for a flexible device is more facilitated. Since the thickness having sufficient flatness and flexibility is different depending on a material forming the substrate 11, although it is necessary to set the thickness depending on a substrate material, the thickness is approximately in a range of from 50 µm to 500 µm.

(Gate Electrode)

A material for the gate electrode 16 is not particularly limited as long as it has high conductivity. Examples of the material for the gate electrode include metal such as Al, Mo, Cr, Ta, Ti, Au, and Ag; Al—Nd; and a metal oxide such as tin oxide, zinc oxide, indium oxide, indium tin oxide (ITO), and indium zinc oxide (IZO). When a layered structure having a single layer or two or more layers is formed using the above material (for example, a metal oxide), a gate electrode can be formed.

When the gate electrode 16 is formed from the above metal or metal oxide, the thickness is preferably from 10 nm to 1000 nm, and more preferably from 50 nm to 200 nm, in consideration of film-formation property, patterning property by etching or a lift-off method, conductivity, and the like.

(Gate Insulating Film)

The gate insulating film 15 is a layer spacing the gate electrode 16; and the oxide semiconductor layer 12, and the source and drain electrodes 13 and 14, in an insulating state, preferably has high insulation properties, and can be formed from, for example, an insulating film formed from $SiO_2$, $SiN_x$, $SiON$, $Al_2O_3$, $Y_2O_3$, $Ta_2O_5$, $HfO_2$ or the like; an insulating film containing two or more kinds of these compounds; or the like.

Although the gate insulating film 15 necessarily has a sufficient thickness to reduce a leak current and to enhance voltage resistance, when the thickness is too thick, there might be a case in which a drive voltage is increased. The thickness of the gate insulating film 15 is, although depending on the material, preferably from 10 nm to 10 µm, more preferably from 50 nm to 1000 nm, and particularly preferably from 100 nm to 400 nm.

(Oxide Semiconductor Layer)

The oxide semiconductor layer 12 includes, from closer to the gate electrode 16, the first region A1 and the second region A2 arranged, in this order, and is disposed facing the gate electrode 16 with the gate insulating film 15 provided therebetween. The first region A1 is an IGZO layer represented by $In(a)\ Ga(b)\ Zn(c)\ O(d)$, in which $a \leq 37/60$, $b \leq 91a/74 - 17/40$, $b \geq 3a/7 - 3/14$, $c \leq 3/5$, $a>0$, $b>0$, $c>0$, $d>0$, and $a+b+c=1$. The second region A2 is represented by $In(p)\ Ga(q)\ Zn(r)\ O(s)$, in which $q/(p+q) > 0.250$, $p>0$, $q>0$, $r>0$, and $s>0$, is an oxide semiconductor film having a composition different from the first region A1, and is located at a side farther than the first region A1 with respect to the gate electrode 16, that is, on a side opposite to a surface of the first region A1 which contacts the gate insulating film 15.

—First Region—

Figure 3:
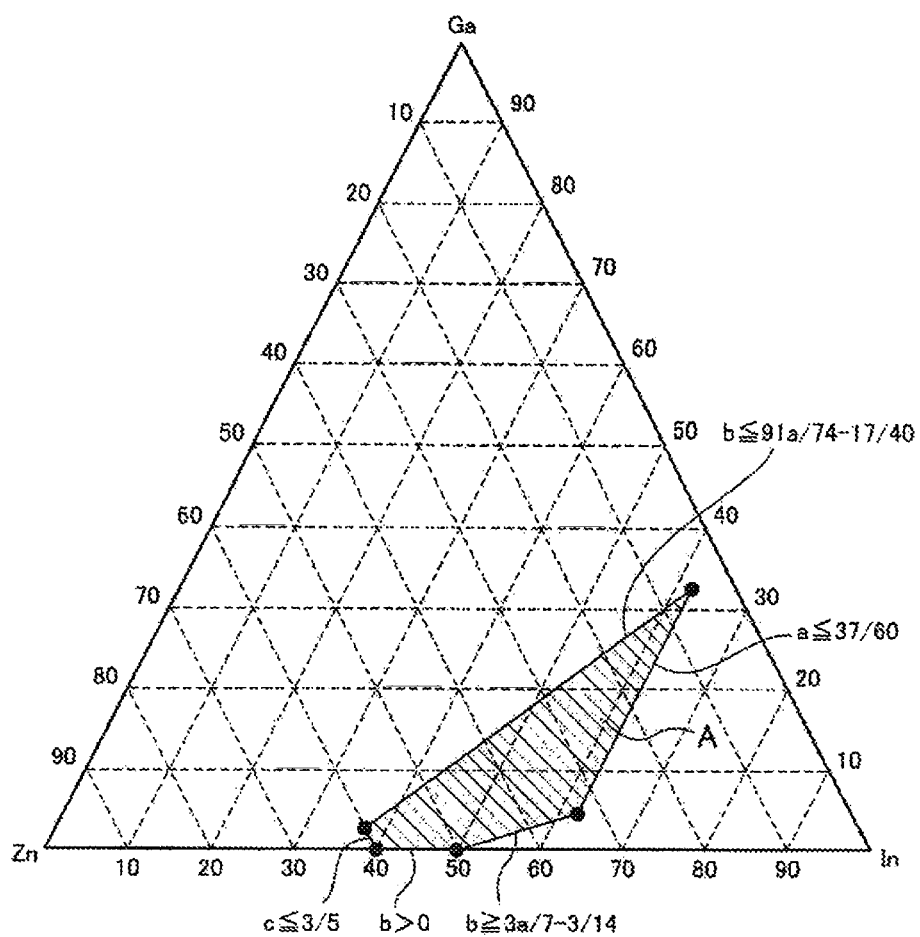
FIG. 3 is a view showing a composition range in a first region in a ternary phase diagram-notation.

FIG. 3 shows a composition range of the first region A1 in a ternary phase diagram-notation. In an oxide semiconductor forming an active layer, in general, as an electron carrier concentration increases, the field-effect mobility increases. That is, in the thin film transistors 1 and 2 of one embodiment in the invention, the first region A1 which is located near the gate electrode 16 and becomes a current transit layer under a state in which a positive gate voltage is applied is preferably an oxide semiconductor layer having a certain degree of carrier concentration.

Further, it is considered that the lower end of a conduction band of IGZO is formed by overlapping of 5 s orbit of In, and it has been known that the In content ratio exceedingly influences on the characteristics of the IGZO system.

Figure 4:
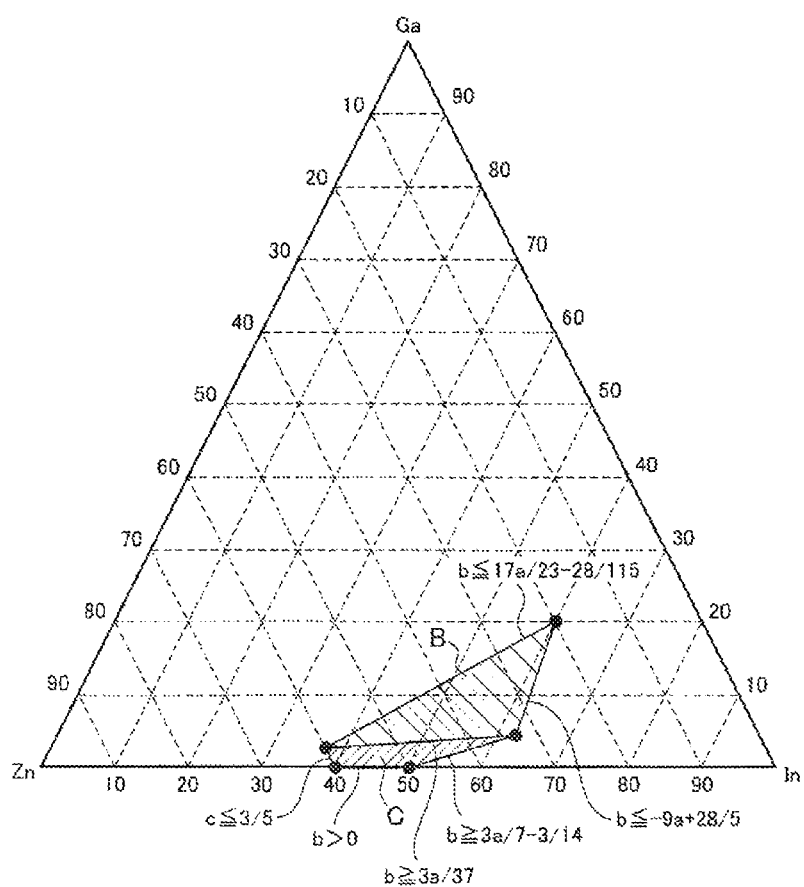
FIG. 4 is a view showing a preferred composition range in the first region in the ternary phase diagram-notation.

When the oxide semiconductor layer 12 of the TFT according to one embodiment in the invention in the first region A1 preferably has a composition range represented by b≤17a/23−28/115, b≤−9a+28/5, b≥3a/7−3/14, c≤3/5, and a+b+c=1, that is, when the oxide semiconductor layer 12 has a composition range in a region shown by B and C in FIG. 4, a thin film transistor which has a field-effect mobility of more than 30 cm²/Vs and achieves normally-off is obtained.

When the In content, in the first region A1, is increased more than the composition range represented by B in FIG. 4, that is, when a is increased, the carrier concentration is in an excess state, and although the field-effect mobility is more than 30 cm²/Vs, it is difficult to obtain a thin film transistor with normally-off.

In contrast, when a Zn content and a Ga content are increased, in the first region A1, more than the composition range represented by B in FIG. 4, there might be a case in which the In content ratio is relatively reduced. Therefore, although the thin film transistor with normally-off is easily obtained, the field-effect mobility is reduced by lowering of the carrier concentration, and it is difficult to realize more than 30 cm²/Vs simultaneously.

In the thin film transistor according to the invention, the composition of the IGZO layer (the first region) with a high In content ratio in which degenerate conduction generally tends to occur is controlled as the first region on the side closer to the gate electrode, whereby a low off-current can be realized while keeping high mobility of IGZO. When a single IGZO layer having the same composition is used as an active layer, although it is difficult to realize a low off-current, the mobility of more than 30 cm²/Vs and a low off-current of 1E−9A or less can be simultaneously realized by controlling the composition and the film thickness of the second region which is located farther than the first region with respect to the gate electrode and is apart from the IGZO layer.

The oxide semiconductor layer in the thin film transistors 1 and 2 of one embodiment in the invention has IGZO as a current path in the first region A1, and a thin film transistor in which time degradation of the characteristics and characteristics deterioration due to voltage application stress at the time of driving are reduced can be provided, compared to a case in which the first region A1 which is to be a channel layer is formed from, for example, IZO or the like. The stability against electrical stress is favorable, compared to a single IGZO film.

In the thin film transistors 1 and 2 of one embodiment in the invention, since the first region A1 and the second region A2 which form the oxide semiconductor layer are formed from the same kind of material containing In, Ga, Zn, and O, a defect density at an interface is reduced compared to a case in which the first region A1, which is substantially to be a channel layer, contacts a dissimilar material such as Si-based material or the like, and thus a thin film transistor which is excellent in terms of uniformity, stability, and reliability can be provided. Particularly, the stability against the electrical stress is favorable compared to a single oxide semiconductor (IGZO) film.

Since the first region A1 which is to be the channel layer is not exposed to atmospheric air, deterioration of device characteristics depending on time and the environment where the device is placed is reduced.

The thickness of the first region A1 of the oxide semiconductor layer is preferably 50 nm or less. More preferably, the layer thickness of the first region A1 is 20 nm or less, and further preferably from 5 nm to less than 10 nm.

When the thickness of the first region A1 is 5 nm or more, the uniformity of the oxide semiconductor layer is enhanced, and high mobility is likely to be obtained. When the thickness of the first region A1 is less than 10 nm, the total number of the carriers is reduced to facilitate pinch-off.

—Second Region—

The second region A2 on a side far from the gate electrode 16 in the oxide semiconductor layer 12 is located on a side farther than the first region A1 with respect to the gate electrode 16, that is, on a side opposite to a surface of the first region A1 which contacts the gate insulating film 15. The second region A2 is represented by In(p) Ga(q) Zn(r) O(s), in which q/(p+q)>0.250, p>0, q>0, r>0, and s>0, and has a composition different from the composition of the first region A1.

In the thin film transistors 1 and 2 of one embodiment in the invention, the source electrode 13 and the drain electrode 14 contact the oxide semiconductor layer 12 mainly with the second region A2 provided therebetween. Thus, when the second region A2 represented by In(p) Ga(q) Zn(r) O(s), in which q/(p+q)>0.250, p>0, q>0, r>0, and s>0, is q/(p+q)>0.875 (that is, Ga rich), the contact resistance between the source and drain electrodes 13 and 14 and the oxide semiconductor layer 12 increases, and the field-effect mobility tends to be reduced. Accordingly, in order to produce a thin film transistor having high mobility, the second region A2 is preferably q/(p+q)≤0.875.

When it is q/(p+q)≤0.250 in the second region A2, a Fermi level and a conduction band are relatively close to each other in the second region A2, and the electron affinity increases, thereby becoming a state in which resistance tends to be reduced. When the oxide semiconductor film (the second region A2) joined to the first region A1 is formed in this state, a condition in which a conduction path tends to be formed near a surface and in bulks of the first region A1 and the second region A2 occurs, and there is a tendency to lead to increase in off-current. Accordingly, in the second region A2 represented by In(p) Ga(q) Zn(r) O(s), in which p>0, q>0, r>0, and s>0, it is required that q/(p+q)>0.250.

The thickness of the second region A2 is preferably more than 10 nm, and more preferably less than 70 nm.

When the thickness of the second region A2 is more than 10 nm, favorable transistor characteristics with a small S value is obtained. When the thickness of the second region A2 is 10 nm or less, deterioration of the S value tends to occur. Particularly, when the thickness of the second region A2 is 30 nm or more, the reduction in off-current can be expected.

When the thickness of the second region A2 is 70 nm or more, the reduction in off-current can be expected and there is no problem from the viewpoint of the S value; however, a resistance component (resistance in the second region) existing between the source and drain electrodes 13 and 14 and the first region A1 is increased, whereby the field-effect mobility tends to be reduced. Accordingly, the thickness of the second region A2 is preferably more than 10 nm and less than 70 nm.

The film thickness of the entire oxide semiconductor layer 12 (total film thickness) is preferably approximately from 10 to 200 nm, and more preferably more than 15 nm and less than 80 nm, from the viewpoints of the uniformity and patterning property of the film.

(Source and Drain Electrodes)

The material and the structure for the source and drain electrodes 13 and 14 are not particularly limited as long as they have a high conductivity. Examples of the material for the source electrode and the drain electrode include metal such as Al, Mo, Cr, Ta, Ti, Au, and Ag; Al—Nd; and metal oxides such as tin oxide, zinc oxide, indium oxide, indium tin oxide (ITO), and indium zinc oxide (IZO). The source and drain electrodes 13 and 14 can be formed by forming a layered structure having a single layer or two or more layers using the above material (for example, a metal oxide).

When the source electrode 13 and the drain electrode 14 are formed from the above metal or metal oxide, the thickness thereof is preferably from 10 nm to 1000 nm, and more preferably from 50 nm to 100 nm, in consideration of film formation property and patterning property by etching or a lift-off method, conductivity, and the like.

<Method of Producing Thin Film Transistor>

Next, a method of producing a bottom gate-top contact type—the thin film transistor 1 shown in FIG. 1 is described.

(Formation of Gate Electrode)

First, the substrate 11 is provided, and after a layer other than the thin film transistor 1 is formed on the substrate 11 if necessary, the gate electrode 16 is formed.

The gate electrode 16 may be formed in accordance with a method suitably selected from, for example, a printing method; a wet method such as a coating method or the like; a physical method such as a vacuum deposition method, a sputtering method, an ion plating method, or the like; and a chemical method such as CVD, plasma CVD method, or the like, in consideration of compatibility with a material to be used. For example, after an electrode film is formed, a patterning is performed so as to have a certain form by etching or a lift-off method, thereby forming the gate electrode 16. At that time, it is preferable that the gate electrode 16 and a gate wiring are simultaneously subjected to patterning.

(Formation of Gate Insulating Film)

After the formation of the gate electrode 16, the gate insulating film 15 is formed.

The gate insulating film 15 may be formed in accordance with a method suitably selected from a printing method; a wet method such as a coating method or the like; a physical method such as a vacuum deposition method, a sputtering method, an ion plating method or the like; a chemical method such as CVD, plasma CVD method, or the like, in consideration of compatibility with a material to be used. For example, the gate insulating film 15 may be subjected to patterning so as to have a certain shape by photolithography or etching.

(Formation of Oxide Semiconductor Layer)

Subsequently, as the oxide semiconductor layer 12, the first region A1 and the second region A2 are formed in this order by a film-formation method such as a vapor phase film formation method such as a sputtering method, a pulsed laser deposition method (PLD method), or a CVD method; or an ink jet method. Specifically, on the insulating film 15, an IGZO film as the first region A1 in a composition range represented by In(a) Ga(b) Zn(c) O(d), in which $0<a \leq 37/60$, $3a/7-3/14 \leq b \leq 91a/74-17/40$, $b>0$, $0<c \leq 3/5$, $a+b+c=1$, and $d>0$) (a region indicated as A in FIG. 3), preferably a composition range satisfying $b \leq 17a/23-28/115$, $b \leq -9a+28/5$, $b \geq 3a/7-3/14$, and $c \leq 3/5$ (a region indicated as B and C in FIG. 4), or composition range satisfying $b \leq 17a/23-28/115$, $b \leq -9a+28/5$, $b \geq 3a/37$ (a region indicated as B in FIG. 4) is formed. When the first region A1 is in a composition range indicated as C in FIG. 4, it is advantageous in terms of the characteristics stability at the time of voltage stress.

Subsequently, an IGZO film as the second region A2, which is represented by In(p) Ga(q) Zn(r) O(s), in which $q/(p+q)>0.250$, $p>0$, $q>0$, $r>0$, and $s>0$, and particularly preferably $0.250<q/(p+q) \leq 0.875$, is formed.

—Film-Formation of First Region—

For example, a film as the first region A1 in which $a=37/60$, $b=1/20$, and $c=1/3$ is formed so as to have a film thickness of 5 nm. As a film-formation method so as to have the composition ratio of metal elements, as long as sputtering film formation is employed, co-sputtering using In, Ga, and Zn or oxides thereof or using a combination of targets of composite oxides thereof may be performed, or a composite oxide target in which the composition ratio of metal elements in the IGZO film thus formed is the above value provided in advance and then single sputtering may be performed, onto the first region A1.

Although a substrate temperature during film formation may be arbitrarily selected depending on a substrate, when a flexible substrate made from resin is used, it is preferable that the substrate temperature is closer to room temperature in order to prevent deformation of the substrate.

In the case of increasing the carrier density in the first region A1, an oxygen partial pressure in a film-formation chamber at the time of film formation may be relatively reduced, to reduce an oxygen concentration in a film. For example, the ratio of oxygen partial pressure/argon partial pressure at the time of film formation is set to 0.005. In the case of reducing the electron carrier density, the oxygen partial pressure in the film-formation chamber at the time of film formation may be relatively increased (for example, ratio of the oxygen partial pressure/argon partial pressure at the time of film formation is 0.067), oxygen radicals may be irradiated during or after film formation, or ultraviolet light may be irradiated to the film-formed surface in an ozone atmosphere, to increase the oxygen concentration in the film.

In the method of producing a thin film transistor according to one embodiment in the invention, it is preferable that a first ratio of oxygen partial pressure/argon partial pressure at the time when the first region A1 is formed by sputtering is higher than a second ratio of oxygen partial pressure/argon partial pressure at the time when the second region A2 is formed by sputtering.

—Film Formation of Second Region—

After the formation of the IGZO film which is the first region A1, an IGZO film which is to be the second region A2 is formed. The film formation of the second region A2 may be performed by a method of stopping the film formation temporarily after the film formation of the first region A1, changing the oxygen partial pressure in the film-formation chamber and an electric power applied to a target, and then resuming the film formation, or a method of rapidly or slowly changing the oxygen partial pressure in the film-formation chamber and the electric power applied to the target without stopping the film formation.

As for the target, a method of changing an input power, using, as it is, a target used in the film formation of the first region A1 may be performed, a method of stopping the input of electric power to the target used in the film formation of the first region A1 when the film formation of the first region A1 is switched to the film formation of the second region A2 and applying the electric power to a different target including In, Ga, and Zn may be performed, or a method of further applying electric power to plural additional targets in addition to applying electric power to the target used in the film formation of the first region A1 may be performed. For example, as the second region A2, an IGZO layer represented by In(p) Ga(q) Zn(r) O(s), wherein $p>0$, $q>0$, $r>0$, $s>0$, and $q/(p+q)=0.750$, is formed to have a thickness of 50 nm.

The substrate temperature at the time when the second region A2 is formed may be arbitrarily selected depending on the substrate, when a flexible substrate made from resin is used, the substrate temperature is preferably closer to room temperature as in the film formation of the first region A1.

In the case of increasing the carrier density of the second region A2, the oxygen partial pressure in the film-formation chamber at the time of film formation may be relatively reduced to reduce the oxygen concentration in a film. For example, the ratio of oxygen partial pressure/argon partial pressure at the time of film formation is set to 0.005. In the case of reducing the electron carrier density, the oxygen partial pressure in the film-formation chamber at the time of film formation may be relatively increased (for example, the ratio of oxygen partial pressure/argon partial pressure at the time of film formation is 0.067), oxygen radicals may be irradiated during or after film formation, or ultraviolet light may be irradiated to the film-forming substrate surface in an ozone atmosphere, or the like to increase the oxygen concentration in the film.

When the oxygen concentration in the film is increased by irradiation with the oxygen radicals or irradiation with the ultraviolet light in the ozone atmosphere, oxygen radicals or ultraviolet light may be irradiated both during or after the film formation of the first region A1 and the second region A2 or only after the film formation of the second region A2. The substrate temperature at the time of irradiating with oxygen radicals may be arbitrarily selected according to the substrate, when a flexible substrate is used, the substrate temperature is preferably closer to room temperature.

When each of the regions A1 and A2 is formed by sputtering, it is preferable that the oxide semiconductor layer 12 is continuously formed without being exposed to the atmospheric air. When the oxide semiconductor layer 12 is formed without being exposed to the atmospheric air, mixing in of impurities can be prevented between the regions A1 and A2, as a result of which, excellent transistor characteristics can be obtained. Further, since the number of processes in film-formation can be reduced, the production cost can also be reduced.

In one embodiment in the invention, when the bottom gate type-thin film transistor 1 is produced, as the oxide semiconductor layer 12, the first region A1 and the second region A2 are formed in this order, and when the top gate type-thin film transistor 2 shown in FIG. 2 is produced, as the oxide semiconductor layer 12, the second region A2 and the first region A1 are formed in this order.

The carrier concentration of the oxide semiconductor layer 12 may be adjusted by composition modulation of the first region A1 and the second region A2 or by controlling the oxygen partial pressure at the time of film formation.

Specifically, controlling of the oxygen concentration in the oxide semiconductor layer 12 can be performed by controlling the respective oxygen partial pressures in the first region A1 and the second region A2 in the film formation. For example, when the oxide semiconductor layer 12 is formed by sputtering, the first region A1 is formed at the first ratio of oxygen partial pressure/argon partial pressure inside the film-formation chamber, and the second region A2 is formed at the second ratio of oxygen partial pressure/argon partial pressure inside the film-formation chamber. When the oxygen partial pressure at the time of film-formation is increased, the carrier concentration can be reduced, and accompanying this, it can be expected that the off-current is reduced. When the oxygen partial pressure at the time of film-formation is reduced, the carrier concentration can be increased, and accompanying this, it can be expected that the field-effect mobility is increased.

During and/or after the film-formation of the first region A1, the oxygen radicals are irradiated to the surface of the first region A1 thus formed, or the ultraviolet light is irradiated to the surface of the first region A1 thus formed in the ozone atmosphere, whereby oxidation of the film is promoted, and an amount of oxygen deficiency in the first region can be reduced.

A light irradiation stability associated with increase in optical bandgap can be imparted by doping, to a portion of Zn of the oxide semiconductor layer 12 formed from the first region A1 and the second region A2, an element ion that increases a bandgap. Specifically, the bandgap of the film can be increased by doping Mg. For example, when Mg is doped in each of the first region A1 and the second region A2, the bandgap can be increased while maintaining a band profile of a layered film, compared to a system in which only the composition ratio of In, Ga, and Zn is controlled.

For example, since a blue light-emitting layer used in an organic electroluminescence (organic EL) exhibits broad light emission having a peak at approximately $\lambda$=450 nm, in the case in which the optical bandgap of the IGZO film is relatively narrow and there is optical absorption in the region, a threshold value-shift in a transistor tends to be occur. Accordingly, as the thin film transistor used for driving the organic EL, it is preferable that the bandgap of a material used in an active layer is greater.

The carrier densities of the first region A1 and the second region A2 can be arbitrarily controlled by cation doping. When the carrier density is desired to increase, a material (such as Ti, Zr, Hf, Ta or the like) which tends to be a cation having relatively large valency may be doped. However, when the cation having large valency is doped, since the number of constituent elements of the oxide semiconductor film is increased, it is preferable to control the carrier density by the oxygen concentration (amount of oxygen deficiency) in terms of simplification of the film-formation process and reduction in cost.

The oxide semiconductor layer 12 is preferably amorphous in terms that the film formation can be performed at a temperature of 300° C. or less. For example, an amorphous IGZO film can be formed at a substrate temperature of 200° C. or less. Whether the oxide semiconductor layer is amorphous can be confirmed by X-ray diffraction measurement. That is, when a clear peak showing a crystal structure is detected by the X-ray diffraction measurement, it can be confirmed that the oxide semiconductor layer is amorphous.

After the formation of the oxide semiconductor layer 12, an anneal treatment may be further performed. The atmosphere at the time of annealing may be arbitrarily selected depending on the film. The annealing temperature may be arbitrarily selected depending on the substrate 11, and when a flexible substrate is used, it is preferable that annealing is performed at a lower temperature (for example, 200° C. or less). When a substrate having a high heat resistance, such as a glass substrate is used, the anneal treatment may be performed at a high temperature close to 500° C.

It is preferable that post anneal treatment is performed at a temperature of 300° C. or more after the film-formation of the first region and the second region, in terms of formation of ohmic contact.

FIG. 5 is a cross-sectional STEM image of a layered film layering five layers including an IGZO film of Ga/(In+Ga)=0.75 and an IGZO film of Ga/(In+Ga)=0.25. FIG. 5A shows immediately after stacking (before an anneal treatment), and FIG. 5B shows the layered film processed at an annealing temperature of 600° C. It can be confirmed from FIG. 5 that the layered structure in the layered structure of the IGZO film is maintained when the anneal treatment is performed at 600° C.

Patterning is performed such that the oxide semiconductor film in which the first region A1 and the second region A2 are layered is arranged facing the gate electrode 16 to be formed later with the gate insulating film 15 provided therebetween, whereby the oxide semiconductor layer 12 is formed. Patterning can be performed, for example, by photolithography and etching. Specifically, a resist pattern is formed on a portion to be remained by photolithography and is etched with an acid solution such as hydrochloric acid, nitric acid, sulfuric acid, or a mixed liquid of phosphoric acid, nitric acid, and acetic acid, or the like, to form a pattern.

(Formation of Source Electrode and Drain Electrode)

After the formation of the oxide semiconductor layer 12, a metal film used for the formation of the source and drain electrodes 13 and 14 is formed on the oxide semiconductor layer 12.

Both the source electrode 13 and the drain electrode 14 may be formed in accordance with a method suitably selected from, for example, a printing method, a wet method such as a coating method; a physical method such as a vacuum deposition method, a sputtering method, an ion plating method, or the like; and a chemical method such as CVD, plasma CVD method, or the like, in consideration of a compatibility with a material to be used.

For example, the metal film is subjected to patterning to have a certain shape by etching or a lift-off method to form the source electrode 13 and the drain electrode 14. At this time, it is preferable that patterning on the source electrode 13, the drain electrode 14, and wirings (not shown) connected to the source electrode 13 and the drain electrode 14 is performed simultaneously.

The thin film transistor 1 shown in FIG. 1 can be produced by the above procedure.

The thin film transistor according to the invention realizes both high mobility and normally-off, and can be applied to various devices. Both the display device and the sensor according to the invention using the thin film transistor according to the invention exhibit favorable characteristics with low power consumption. The "characteristics" referred to herein are the display characteristics in the case of the display device and the sensitivity characteristics in the case of the sensor.

<Liquid Crystal Display Device>

Figure 6:
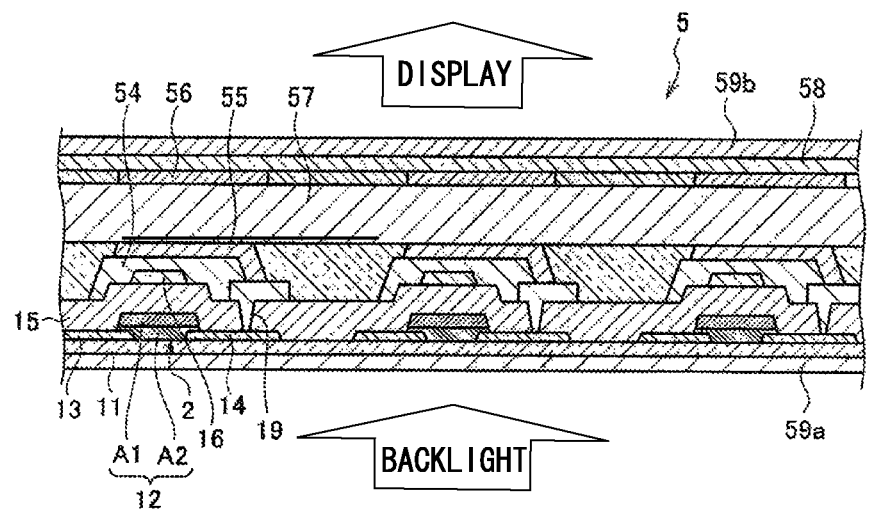
FIG. 6 is a schematic cross-sectional view showing a portion of a liquid crystal display device of one embodiment.
Figure 7:
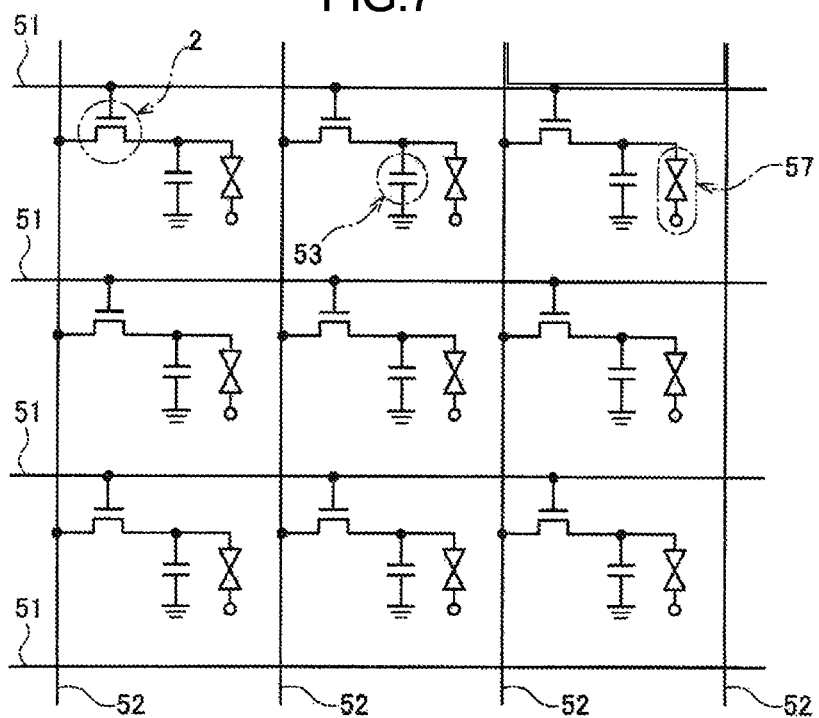
FIG. 7 is a schematic configuration diagram of electrical wiring of the liquid crystal display device of FIG. 6.

FIG. 6 shows a schematic cross-sectional view of a portion of a liquid crystal display device as one embodiment of a display device provided with the thin film transistor according to the invention, and FIG. 7 shows a schematic configuration diagram of electrical wiring thereof.

As shown in FIG. 6, a liquid crystal display device 5 of one embodiment in the invention is provided with the top gate-bottom contact type—the thin film transistor 2 shown in FIG. 2 including the gate electrode 16, the gate insulating film 15, the oxide semiconductor layer 12 formed from the first region A1 and the second region A2, the source electrode 13, and the drain electrode 14; on a passivation layer 54 which is provided on the gate electrode 16 of the thin film transistor 2 and which is for protecting the gate electrode 16 of the thin film transistor 2, a liquid crystal layer 57 which is held between a pixel lower electrode 55 and an upper electrode 56 facing the lower electrode 55; and an RGB color filter 58 for displaying different colors corresponding to each pixel; and is configured such that polarization plates 59a and 59b are provided on the substrate 11-side of the TFT 2 and on the color filter 58, respectively.

As shown in FIGS. 6 and 7, the liquid crystal display device 5 of one embodiment in the invention is provided with plural gate wirings 51 parallel to one another and data wirings 52 which intersect the gate wirings 51 and which are parallel to one another. Here, the gate wiring 51 and the data wiring 52 are electrically insulated. The thin film transistor 2 is provided near the intersection part of the gate wiring 51 and the data wiring 52.

The gate electrode 16 of the thin film transistor 2 is connected to the gate wiring 51, and the source electrode 13 of the thin film transistor 2 is connected to the data wiring 52. The drain electrode 14 of the thin film transistor 2 is electrically connected to the pixel lower electrode 55 through a contact hole 19 provided in the gate insulating film 15 (so that a conductor is embedded in the contact hole 19). The pixel lower electrode 55 and the grounded upper electrode 56 facing thereto form a capacitor 53.

Although the liquid crystal device of one embodiment in the invention shown in FIG. 6 is provided with the top gate type of thin film transistor, the thin film transistor used in the liquid crystal device as the display device according to the invention is not limited to a top gate type-thin film transistor, and a bottom gate type-thin film transistor may be used.

Since the thin film transistor according to the invention has high mobility, high quality display such as high definition, high-speed response, and high contrast can be realized in the liquid display device and is suitable for an increase in size of a screen. Particularly, when the oxide semiconductor layer 12 (active layer) is amorphous, variation in element characteristics can be suppressed, and an excellent display quality without unevenness in a large display screen is realized. Further, since characteristic shift is small, the gate voltage can be reduced, and, furthermore, the power consumption of the display device can be reduced.

According to the invention, the first region A1 and the second region A2 forming the oxide semiconductor layer (active layer) can be formed using an amorphous film capable of being formed at low temperature (for example, 200° C. or less), a resin substrate (plastic substrate) can be used as a substrate. Accordingly, according to the invention, a flexible liquid crystal display device which is excellent in display quality can be provided.

<Organic EL Display Device>

Figure 8:
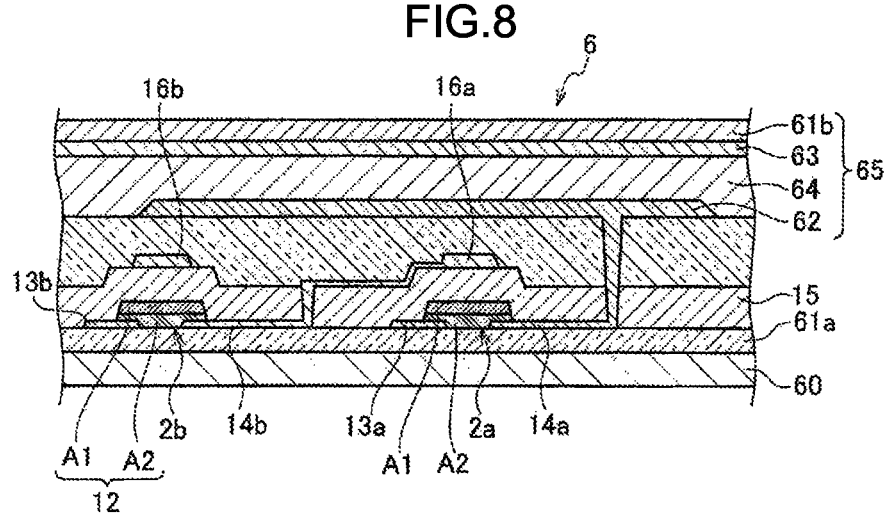
FIG. 8 is a schematic cross-sectional diagram showing a portion of an organic EL display device of one embodiment.
Figure 9:
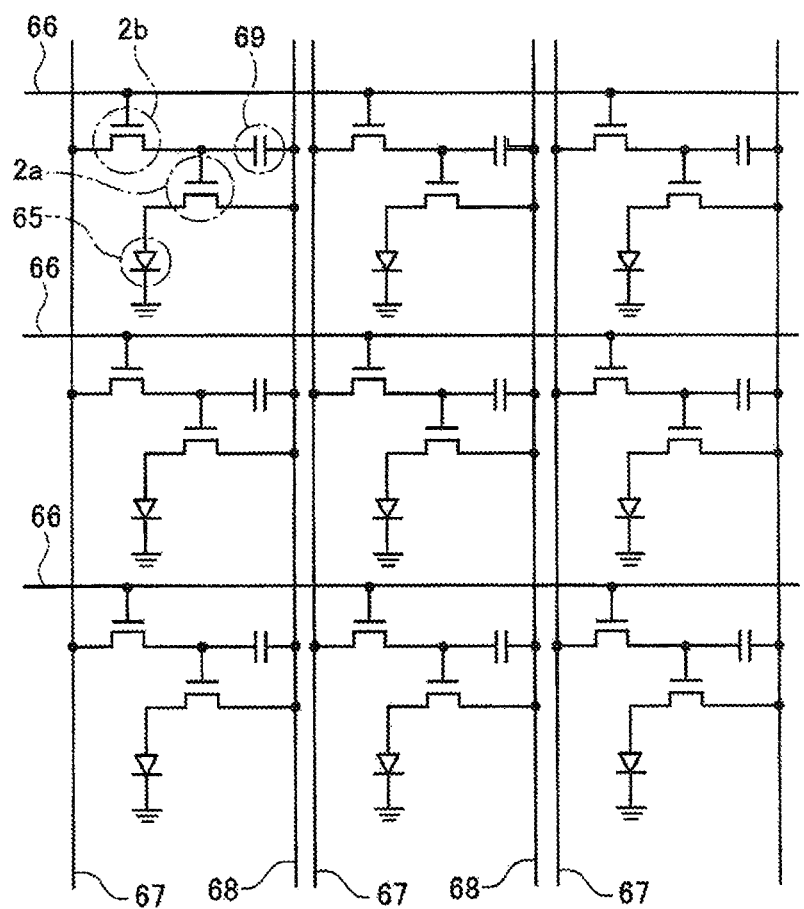
FIG. 9 is a schematic configuration diagram of electrical wiring of the organic EL display device of FIG. 8.

As one embodiment of the display device provided with the TFT according to the invention, a partial schematic cross-sectional view of an active matrix type-organic EL display device is shown in FIG. 8, and FIG. 9 shows a schematic configuration diagram of electrical wiring thereof.

As a system of driving the organic EL display device, there are two kinds of systems, a simple matrix system and an active matrix system. Although it is advantageous in the simple matrix system in terms of production at low cost, since a pixel is made to emit light by selecting every one scanning line, the emission time per one scanning line is inversely proportional to the number of scanning lines. Thus, it is difficult to realize high definition and a large size. In the active matrix system, since a transistor and a capacitor are formed for every pixel, the production cost is high; however, there are no problems such that the number of the scanning lines cannot be increased, as the case of the simple matrix system, and thus, the active matrix system is suitable for the realization of high definition and a large size.

In the active matrix type organic EL display device 6 of one embodiment in the invention, top gate-top contact type-thin film transistors are respectively provided on a passivation layer 61a on a substrate 60, as a driving TFT 2a and a switching TFT 2b. The driving TFT 2a includes a gate electrode 16a, the gate insulating film 15, the first region A1, the second region A2, a source electrode 13a, and a drain electrode 14a. The switching TFT 2b includes a gate electrode 16b, the gate insulating film 15, the oxide semiconductor layer 12 formed from the first region A1 and the second region A2, a source electrode 13b, and a drain electrode 14b. An organic light emitting element 65 which includes an organic light emitting layer 64 placed between a lower electrode 62 and an upper electrode 63, and in which an upper surface of the upper electrode 63 is protected by a passivation layer 61b is provided above the thin film transistors 2a and 2b.

As shown in FIGS. 8 and 9, the organic EL display device 6 of one embodiment in the invention is provided with plural gate wirings 66 parallel to one another and data wirings 67 and driving wirings 68 which intersect the gate wirings 66 and are parallel to one another. Here, the gate wiring 66 is electrically insulated from the data wiring 67 and the driving wiring 68. The gate electrode 16b of the switching thin film transistor 2b is connected to the gate wiring 66, and the source electrode 13b of the switching thin film transistor 2b is connected to the data wiring 67. The drain electrode 14b of the switching thin film transistor 2b is connected to the gate electrode 16a of the driving thin film transistor 2a and keeps the driving thin film transistor 2a in an on-state by using a capacitor 69. The source electrode 13a of the driving thin film transistor 2a is connected to the driving wiring 68, and the drain electrode 14a is connected to an organic EL light emitting element 65.

Also in the organic EL device of one embodiment in the invention shown in FIG. 8, although the top gate type-thin film transistors 2a and 2b are provided, the thin film transistor used in the organic EL device as the display device according to the invention is not limited to the top gate type-thin film transistor, and may be a bottom gate type-thin film transistor.

Since the thin film transistor according to the invention has high mobility, low power consumption and high quality display can be realized. According to the invention, the first region A1 and the second region A2 forming the oxide semiconductor layer (active layer) can be formed using an amorphous film capable of being formed at low temperature (for example, 200° C. or less), a resin substrate (plastic substrate) can be used as a substrate. Accordingly, according to the invention, an organic EL display device which is flexible and excellent in display quality can be provided.

In the organic EL display device shown in FIG. 8, the upper electrode 63 may be a transparent electrode to produce a top emission type organic EL display device, or the lower electrode 62 and each electrode of the TFTs 2a and 2b may be transparent electrodes to produce a bottom emission type organic EL display device.

<X-Ray Sensor>

Figure 10:
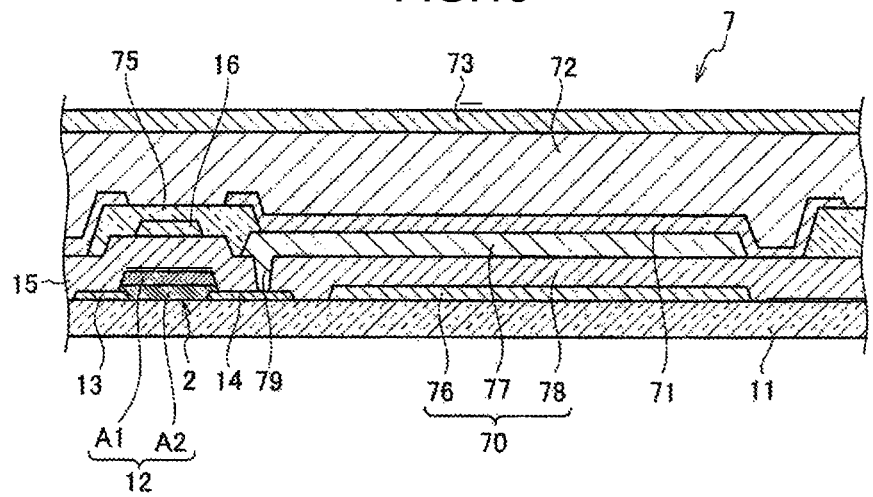
FIG. 10 is a schematic cross-sectional view showing a portion of an X-ray sensor array of one embodiment.
Figure 11:
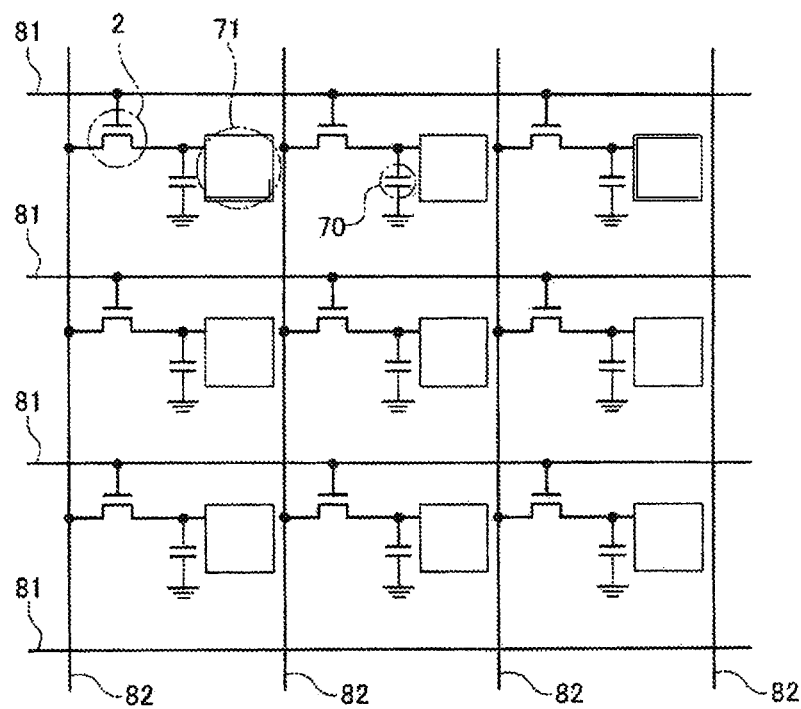
FIG. 11 is a schematic configuration diagram of electrical wiring of the X-ray sensor array of FIG. 10.

FIG. 10 shows a schematic cross-sectional view of a portion of an X-ray sensor as one embodiment of a sensor according to the invention, and FIG. 11 shows a schematic configuration diagram of electrical wiring of the X-ray sensor array thereof.

An X-ray sensor 7 of one embodiment in the invention is configured to be provided with, the thin film transistor 2 including the gate electrode 16, the gate insulating film 15, the oxide semiconductor layer 12 provided with the A1 and the second region A2, the source electrode 13, and the drain electrode 14, and a capacitor 70, each of which is formed on the substrate 11, and a charge collecting electrode 71 formed on the capacitor 70, an X-ray conversion layer 72, and an upper electrode 73. A passivation film 75 is provided on the thin film transistor 2.

The capacitor 70 has a structure in which a lower electrode for capacitor 76 and an upper electrode for capacitor 77 hold an insulating film 78 therebetween. The upper electrode for capacitor 77 is connected to one of the source electrode 13 and the drain electrode 14 of the thin film transistor 2 (the drain electrode 14 in FIG. 10) through a contact hole 79 provided in the insulating film 78.

The charge collecting electrode 71 is provided on the upper electrode for capacitor 77 in the capacitor 70 and contacts the upper electrode for capacitor 77. The X-ray conversion layer 72 is formed from amorphous selenium and provided so as to cover the thin film transistor 2 and the capacitor 70. The upper electrode 73 is provided on the X-ray conversion layer 72 and contacts the X-ray conversion layer 72.

As shown in FIG. 11, the X-ray sensor 7 of one embodiment in the invention is provided with plural gate wirings parallel to one another and plural data wirings 82 which intersect the gate wirings 81 and are parallel to one another. Here, the gate wiring 81 and the data wiring 82 are electrically insulated. The thin film transistor 2 is provided near the intersection part of the gate wiring 81 and the data wiring 82.

In FIGS. 10 and 11, the gate electrode 16 of the thin film transistor 2 is connected to the gate wiring 81, and the source electrode 13 of the thin film transistor 2 is connected to the data wiring 82. The drain electrode 14 of the thin film transistor 2 is connected to the charge collecting electrode 71, and the charge collecting electrode 71 and the grounded electrode 76 facing thereto forms the capacitor 70.

In the X-ray sensor 7 in the present configuration, an X ray is irradiated from an upper portion (a side of the upper electrode 73) in FIG. 10, and an electron-hole pair is generated in the X-ray conversion layer 72. When a high electric field is applied to the X-ray conversion layer 72 by the upper electrode 73, generated electric charges are accumulated in the capacitor 70 and read-out is performed by scanning the thin film transistor 2 in sequence.

Since the X-ray sensor according to the invention is provided with the thin film transistor 2 having a high on-current and an excellent reliability, S/N is high and sensitivity characteristics are excellent, and therefore, when the X-ray sensor is used in an X-ray digital imaging device, an image with wide dynamic range is obtained.

Especially, it is preferable that the X-ray digital imaging device according to the invention is not only capable of taking a still image but also capable of performing fluoroscopy for moving images and taking a still image with a single X-ray digital imaging device. Further, when the first region A1 and the second region A2 forming the oxide semiconductor layer (active layer) in the thin film transistor 2 are amorphous, an image having an excellent uniformity is obtained.

Although the X-ray sensor of one embodiment in the invention shown in FIG. 10 is provided with the top gate type-thin film transistor, the thin film transistor used in the sensor according to the invention is not limited to the top gate type-thin film transistor, and may be a bottom gate type-thin film transistor.

EXAMPLES

Hereinafter, experimental examples will be described; however, the invention is in no way limited to the examples.

The present inventors conducted the following experiments and proved that, as the thin film transistor according to the invention, an element having high mobility and a low off-current can be produced in a specific composition range in the first region A1 and the second region A2 forming the oxide semiconductor layer.

<First Region Composition Dependency of TFT Characteristics>

First, the following bottom gate-top contact type-thin film transistors were produced as Examples 1 to 8 and Comparative Examples 1 to 4.

As a substrate, a p-type silicon substrate (manufactured by Mitsubishi Materials Corporation) in which an $SiO_2$ oxide film (thickness: 100 nm) was formed on a surface so as to be doped at high concentration was used.

As an oxide semiconductor layer, a first region was first formed by sputtering such that the thickness of In(a) Ga(b) Zn(c) O(d) in which a>0, b>0, c>0, d>0, and a+b+c=1 was 5 nm. Here, the composition was modulated as shown in the following Table 2.

As the second region A2, an IGZO film represented by In(p) Ga(q) Zn(r) O(s), in which p>0, q>0, r>0, s>0, and q/(p+q)>0.750, was formed by sputtering so as to have a thickness of 50 nm.

Formation of the oxide semiconductor layer was continuously performed across the regions without being exposed to atmospheric air. As the sputtering for each region, ternary co-sputtering using an $In_2O_3$ target, $Ga_2O_3$ target, and ZnO target was performed in the first and second regions. The film thickness of each region was adjusted by adjusting the film-formation time.

The composition of the first region and the characteristics of the TFT are shown in the following Table 2. The film-formation conditions for the first region are common in Examples 1 to 8 and Comparative Examples 1 to 4 and are as follows.
(Sputtering Conditions for First Region)
Degree of ultimate vacuum: $6 \times 10^{-6}$ Pa
Film-formation pressure: $4.4 \times 10^{-1}$ Pa
Film-formation temperature: room temperature
Oxygen/argon partial pressure: 0.067

The sputtering conditions for the second region are as follows and are common to Examples 1 to 8 and Comparative Examples 1 to 4.
(Sputtering Conditions for Second Region)
Degree of ultimate vacuum: $6 \times 10^{-6}$ Pa
Film-formation pressure: $4.4 \times 10^{-1}$ Pa
Film-formation temperature: room temperature
Oxygen/argon partial pressure: 0.067
Input power ratio of $In_2O_3$, $Ga_2O_3$, and ZnO targets: 19.3:70.0:14.5

After the two kinds of oxide semiconductor films were layered by sputtering, an electrode layer formed from Ti (10 nm)/Au (40 nm) was formed on the layered film by a vacuum deposition method through a metal mask. After the formation of the electrode layer, post anneal treatment was performed at 300° C. in an atmosphere of an oxygen partial pressure of 100%.

Accordingly, the thin film transistors of Examples 1 to 8 and Comparative Examples 1 to 4 shown in the following Table 2 were obtained as the bottom gate type of thin film transistors having a channel length of 180 μm and a channel width of 1 mm.

For the thin film transistors of Examples 1 to 8 and Comparative Examples 1 to 4 thus produced, the transistor characteristics (Vg-Id characteristics) and a mobility μ were measured using a semiconductor parameter analyzer 4156C (manufactured by Agilent Technologies, Inc.).

The measurement of the Vg-Id characteristics was performed such that the drain voltage (Vd) was fixed at 10 V, the gate voltage (Vg) was swept within a range of from −30 V to +30 V, and the drain current (Id) at each gate voltage (Vg) was measured. The off-current (Ioff) was defined by a current value at Vg=0 V in the Vg-Id characteristics.

The mobility is described by calculating a linear mobility from the Vg-Id characteristics in a linear region obtained by sweeping the gate voltage (Vg) within a range of from −30 V to +30 V in such a state that the drain voltage (Vd) is fixed at 1 V.

Figure 12:
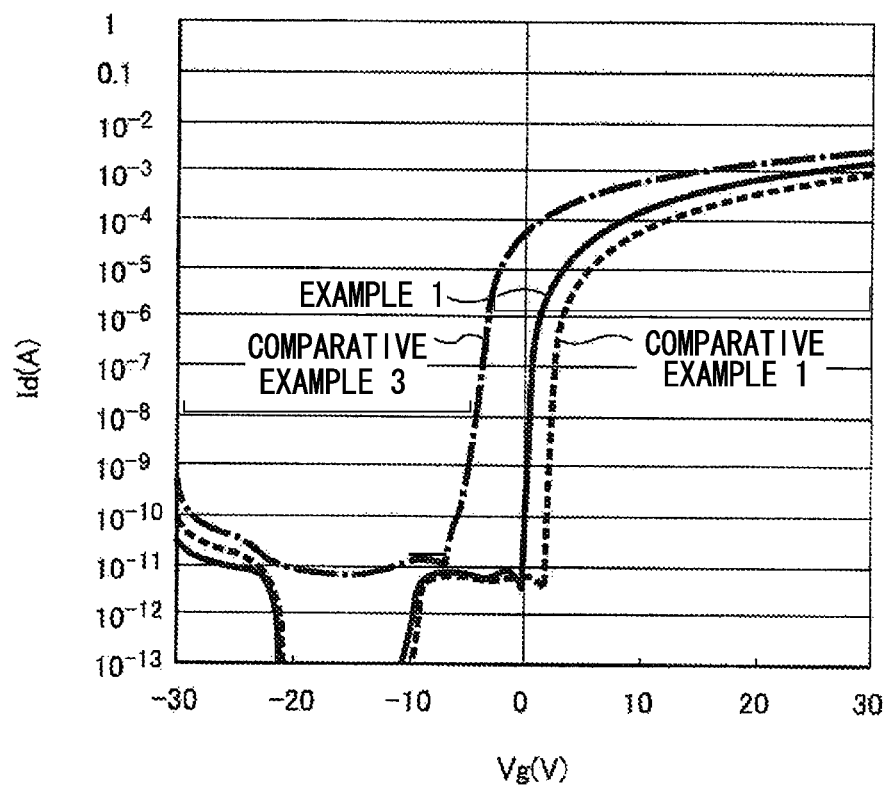
FIG. 12 is a view showing a change in Vg-Id characteristics by composition modulation in the first region.

Among the measurement results, representative Vg-Id curves (Example 1 and Comparative Examples 1 and 3) are shown in FIG. 12.

Figure 13:
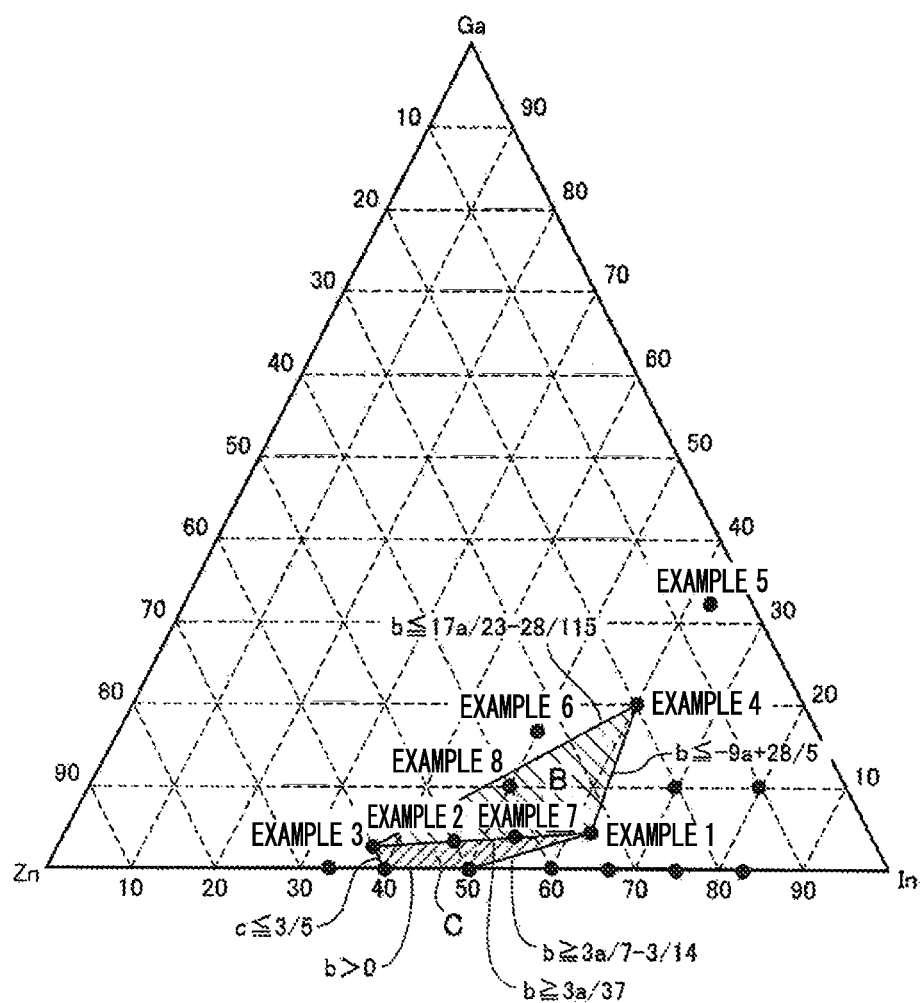
FIG. 13 is a view showing a composition of the first region of Examples and Comparative Examples in the ternary phase diagram-notation.
Figure 14:
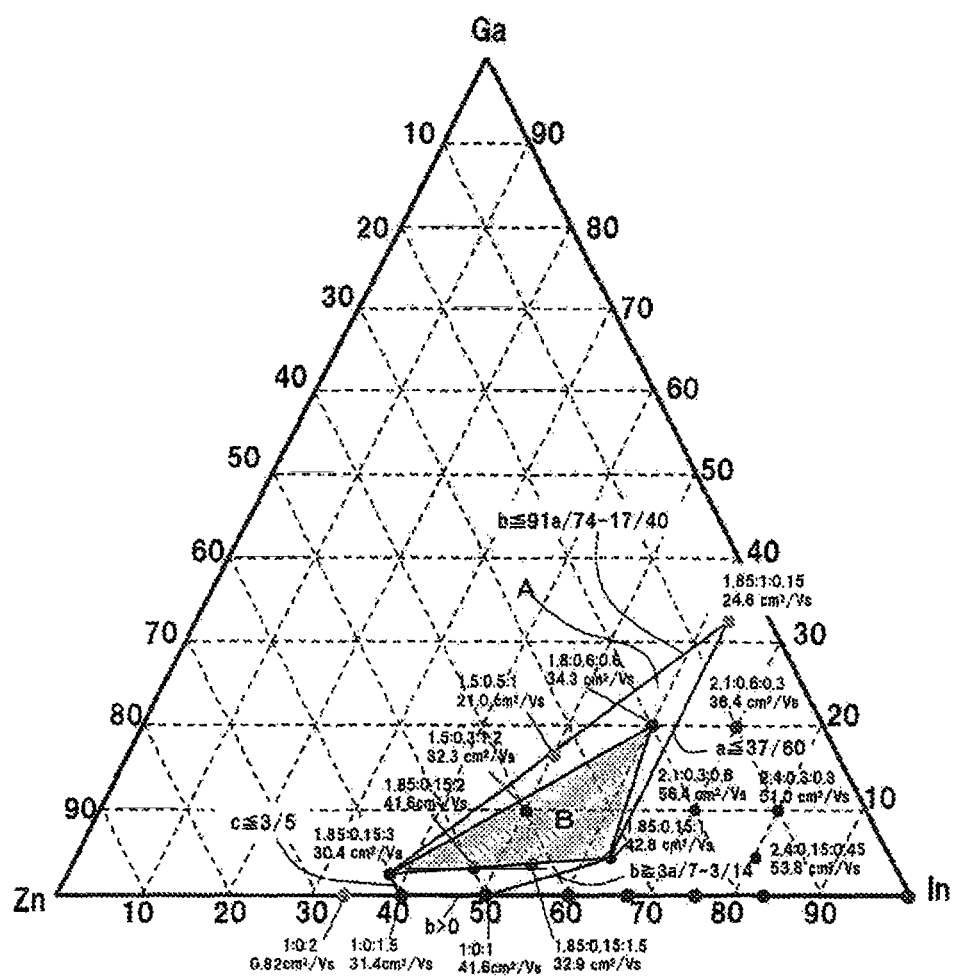
FIG. 14 is a view showing the composition and characteristics of the first region of Examples and Comparative Examples in the ternary phase diagram-notation.

The characteristics provided when the composition in the first region is modulated are summarized in the ternary phase diagrams of FIGS. 13 and 14. In the region of FIG. 13, when there is a composition range in the region B surrounded by a triangle, normally-off and a high mobility of more than 30 $cm^2/Vs$ can be realized simultaneously. This region corresponds to a composition range represented by b≤17a/23−28/115, b≥3a/37, and b≤−9a+28/5 (wherein a+b+c=1).

In Example 1 in which the first region composition is within a region represented by a region A in FIG. 14, normally-off (Id≤1E−9, Vg=0 V) operation and a high mobility of μ=42.8 $cm^2/Vs$ are obtained. In contrast, in Comparative Examples 1 to 4 in which the In content is particularly increased more than in Example 1, the carrier concentration is excessive, and although high mobility is obtained, normally-off driving is difficult.

The results of the composition ratio in the first region, the mobility, and the off-current in Examples 1 to 8 and Comparative Examples 1 to 4 are summarized in the following Table 2.

TABLE 2

|  | Target input power (W) | Cation composition | | | Field-effect mobility | |
| --- | --- | --- | --- | --- | --- | --- |
|  | $In_2O_3$:$Ga_2O_3$:ZnO | a | b | c | ($cm^2/Vs$) | Ioff (A) |
| Example 1 | 47.3:23.1:14.0 | 37/60 | 3/60 | 20/60 | 42.8 | 6.3E−10 |
|  |  | 0.617 | 0.050 | 0.333 |  |  |
| Example 2 | 47.3:23.1:22.0 | 37/80 | 3/80 | 40/80 | 41.6 | 5.3E−12 |
|  |  | 0.462 | 0.038 | 0.500 |  |  |
| Example 3 | 47.3:23.1:32.0 | 37/100 | 3/100 | 60/100 | 30.4 | 2.8E−11 |
|  |  | 0.37 | 0.030 | 0.60 |  |  |
| Example 4 | 47.3:44.8:10.0 | 6/10 | 2/10 | 2/10 | 34.3 | 8.5E−12 |
|  |  | 0.60 | 0.20 | 0.20 |  |  |
| Example 5 | 48.0:63.4:5.0 | 37/60 | 20/60 | 3/60 | 24.6 | 5.5E−12 |
|  |  | 0.617 | 0.333 | 0.05 |  |  |
| Example 6 | 43.4:41.7:14.5 | 3/6 | 1/6 | 2/6 | 21.0 | 1.1E−11 |
|  |  | 0.50 | 0.167 | 0.333 |  |  |
| Example 7 | 47.3:23.1:18.5 | 37/70 | 3/70 | 30/70 | 32.9 | 2.4E−10 |
|  |  | 0.529 | 0.043 | 0.428 |  |  |
| Example 8 | 43.8:30.5:16.0 | 5/10 | 1/10 | 4/10 | 32.3 | 6.8E−10 |
|  |  | 0.50 | 0.10 | 0.40 |  |  |
| Comparative Example 1 | 55.3:44.8:6.0 | 7/10 | 2/10 | 1/10 | 36.4 | 7.4E−7 |
|  |  | 0.70 | 0.20 | 0.10 |  |  |

TABLE 2-continued

|  | Target input power (W) In$_2$O$_3$:Ga$_2$O$_3$:ZnO | Cation composition | | | Field-effect mobility (cm$^2$/Vs) | Ioff (A) |
|---|---|---|---|---|---|---|
|  |  | a | b | c |  |  |
| Comparative Example 2 | 55.3:29.8:5.5 | 8/10 0.80 | 1/10 0.10 | 1/10 0.10 | 51.0 | 6.3E−5 |
| Comparative Example 3 | 55.3:21.0:7.5 | 7/10 0.70 | 1/10 0.10 | 2/10 0.20 | 56.4 | 3.9E−5 |
| Comparative Example 4 | 50.8:29.8:8.5 | 16/20 0.8 | 1/20 0.05 | 3/20 0.15 | 53.8 | 1.5E−4 |

When the composition and the film-formation conditions of the second region are the same, it was found that the transistor characteristics significantly depended on the composition in the first region. Particularly, it was clear that a field-effect mobility of more than 30 cm$^2$/Vs and the normally-off (Id=IE−9, Vg=0) characteristics were simultaneously realized in a range of b≤17a/23−28/115, b≥3a/37, b≤−9a+28/5 (wherein a+b+c=1).

<IGZO Layer Composition Dependency of TFT Characteristics>

In order to evaluate how the TFT characteristics are changed by the composition in the second region, the following bottom gate-top contact type-thin film transistors of Examples 9 to 13 and Comparative Examples 5 and 6 were produced. The method of producing a transistor was basically similar to that of Example 1, and the first region was fixed at IGZO (a:b:c=37/60:3/60:20/60), and only the composition in the second region was modulated as shown in the following Table 3.

As for the film-formation conditions of the second region, the degree of ultimate vacuum, the film-formation pressure, the film-formation temperature, and the oxygen/argon partial pressure are common; they are 6×10$^{-6}$ Pa, 4.4×10$^{-1}$ Pa, room temperature, and 0.067, respectively; and the film-formation was performed by modulating the cation-composition-ratio as shown in the following Table 3. Annealing was performed under the following conditions after the film formation.

(Post Annealing Conditions)
Annealing temperature: 300° C.
Annealing time: 1 hour
Annealing atmosphere: oxygen partial pressure 100%

The mobility and the off-current were measured, and the measurement results are shown in the following Table 3.

stood that it is difficult to produce a TFT having high mobility when q/(p+q)>0.875 (by controlling the oxygen partial pressure in the film formation of the second region, a TFT that is capable of operating can be produced). Accordingly, it is understood that when the composition used in the first region is the same, q/(p+q) in the second region is preferably 0.875 or less.

When q/(p+q) is reduced to 0.250 (Comparative Example 6), it is understood that a threshold value is significantly negatively shifted and the off-current is significantly increased. As factors of the increase in off-current, it is described that the carrier concentration in the second region is relatively increased by increasing the In content ratio and the electron affinity is relatively increased. It is considered that, at this time, a carrier flows from the first region into the second region, or a conduction carrier path is produced in the second region, and when a great extent of negative gate bias is not applied, pinch-off is difficult. Thus, in order to produce a transistor having high mobility and low off-current, it is required that q/(p+q)>0.250.

Accordingly, in a case where the composition used in the first region is the same, when the composition in the second region is 0.250<q/(p+q)≤0.875, a TFT having low off-current can be produced while maintaining high mobility.

<IGZO Layer Film Thickness Dependency of TFT Characteristics>

Next, the following bottom gate-top contact type-thin film transistors were produced as Examples 15 to 17. The thin film transistors of Examples 15 to 17 were produced in a manner such that the composition and the configuration of Examples 15 to 17 is basically similar to those of Example 1, except that the composition in the first region is IGZO (1.85:0.15:1, in which the composition is the same as that in Example 1), the

TABLE 3

|  | Target input power (W) | | | Second region | | Field-effect mobility |  |
|---|---|---|---|---|---|---|---|
|  | In$_2$O$_3$ | Ga$_2$O$_3$ | ZnO | In:Ga:Zn | q/(p + q) | (cm$^2$/Vs) | Ioff (A) |
| Example 9 | 19.3 | 70.0 | 14.5 | 0.5:1.5:1 | 0.75 | 42.8 | 6.3E−10 |
| Example 10 | 37.5 | 52.5 | 13.5 | 1.25:0.75:1 | 0.375 | 48.6 | 5.0E−10 |
| Example 11 | 31.5 | 63.4 | 15.5 | 1:1:1 | 0.50 | 49.3 | 1.8E−10 |
| Example 12 | 13.3 | 70.0 | 14.0 | 0.25:1.75:1 | 0.875 | 46.0 | 3.3E−11 |
| Example 13 | 41.0 | 47.1 | 14.0 | 1.44:0.56:1 | 0.28 | 47.2 | 8.9E−10 |
| Comparative Example 5 | 0 | 66.5 | 11.0 | 0:2:1 | 1.00 | Not driven | — |
| Comparative Example 6 | 43.4 | 41.7 | 14.5 | 1.5:0.5:1 | 0.25 | 84.7 | 1.7E−3 |

As understood from Table 3, the TFT does not operate in the case of Comparative Example 5 in which the second region is p=0 and q/(p+q)>0.875. It is considered that this is because the contact resistance between the source and drain electrodes and the second region is increased, and it is under-composition in the second region is fixed at IGZO (0.5:1.5:1), and the film thickness of the second region is changed to 10 nm, 30 nm, 50 nm, and 70 nm, respectively. How the film thickness of the second region influences the TFT characteristics was evaluated using the thin film transistors of Examples 15 to 17 thus produced. The configuration and the TFT characteristics of the transistors are shown in the following Table 4.

TABLE 4

|  | Second region film thickness (nm) | Field-effect mobility (cm²/Vs) | Ioff (A) | S value (V/decade) |
|---|---|---|---|---|
| Example 15 | 10 | 52.7 | 8.7E−10 | 1.07 |
| Example 16 | 30 | 43.0 | 5.3E−10 | 0.31 |
| Example 1 | 50 | 42.8 | 6.3E−10 | 0.12 |
| Example 17 | 70 | 30.7 | 2.5E−11 | 0.20 |

As shown in Table 4, it is understood that although all the thin film transistors have high mobility and low off-current, in the case that the film thickness of the second region is 10 nm or less, while the mobility is high, the thin film transistor has a deteriorated S value and tends to have increased off-current. In contrast, when the film thickness of the second region is 30 nm or more, the S value is favorable, and it can be expected that the off-current is reduced. Accordingly, when the composition used in the first region is the same, the film thickness of the second region is preferably more than 10 nm, and more preferably 30 nm or more. When the film thickness of the second region is 70 nm or more, it is seen that the mobility is slightly lowered, and therefore, the film thickness of the second region is particularly preferably less than 70 nm.

In the above Examples 1 to 8, although the film thickness of the second region is 50 nm, all the examples simultaneously realize high mobility and normally-off, and the S value is favorable (0.5 V/decade or less). Although the composition in the first region is extremely different in Examples 1 to 8, this suggests that the above tendency is applicable even when the composition in the first region is different. Accordingly, when the composition in the first region is fixed, it is understood that the film thickness of the second region is preferably more than 10 nm and less than 70 nm.

<Driving Stability of Transistor>

Next, in the transistor of Example 1, the driving stability was evaluated by continuously applying a constant voltage. As a comparative example, a general IGZO-TFT (Comparative Example 7) was produced in a similar manner as in Example 2, except that an active layer portion was a single IGZO film (In:Ga:Zn=1:1:1) (film thickness: 50 nm). Further, a TFT (Comparative Example 8) having a similar configuration to the TFT of Example 1 was produced, except that the first region was IZO (In:Zn=1:1).

As a constant voltage stress, Vg=+15 V and Vd=+10 V was continuously applied, and after a lapse of a predetermined time, Vg was swept to evaluate the Vg-Id characteristics. After termination of the evaluation of the Vg-Id characteristics, the constant voltage stress was continuously applied again.

Figure 15:
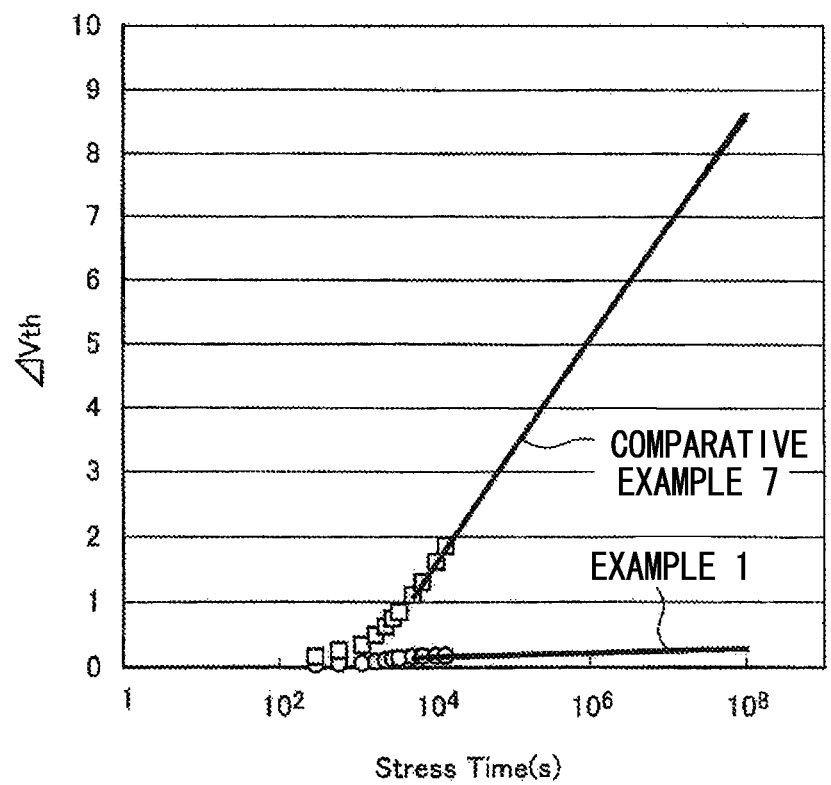
FIG. 15 is a view showing a change in a threshold value shift with respect to a stress time (ΔVth).

A shift amount ($\Delta$Vth) of a threshold value with respect to stress time is shown in FIG. 15. Further, the extrapolation is performed from a data point of the stress time dependency of $\Delta$Vth in FIG. 15, using exponential approximation, and a shift amount of the threshold value after $10^8$ seconds thus calculated is shown in Table 5. Vth in the evaluation of $\Delta$Vth was calculated from the intersection point of the Vg-Id curve and a normalized current value W/L×$10^{-9}$ (A).

Table 5 shows the field-effect mobility and Vth of Example 1 and Comparative Examples 7 and 8.

TABLE 5

|  | Active layer | Field-effect mobility (cm²/Vs) | $\Delta$Vth ($10^8$ s) |
|---|---|---|---|
| Example 1 | IGZO (5 nm)/IGZO (50 nm) | 42.8 | 0.28 |
| Comparative Example 7 | IGZO (50 nm) | 15.0 | 8.62 |
| Comparative Example 8 | IZO (5 nm)/IGZO (50 nm) | 41.6 | 0.59 |

As shown in FIG. 15, it is clear that the stability against continuous driving of the transistor according to the invention was extremely high, compared to a conventional IGZO-TFT. Further, as shown in Table 5, when IGZO is used as in the present examples, the stability against voltage application stress at the time of driving is high, compared to a case of particularly using IZO in the first region which is to be a current path. It is understood that, by using the transistor according to the invention, the field-effect mobility is twice or more of the field-effect mobility of a conventional IGZO-TFT, and the number of digits of the stability against continuous driving is improved by one or more.

<Annealing Temperature Dependency of TFT Characteristics>

After the first region is formed in the same condition as Example 1, film formation was performed by modulating a cation composition ratio as shown in the following Table 6. In the film-formation conditions of the second region, the degree of ultimate vacuum, the film-formation pressure, the film-formation temperature, and the oxygen/argon partial pressure are common, and they are $6 \times 10^{-6}$ Pa, $4.4 \times 10^{-1}$ Pa, room temperature, and 0.067, respectively. Annealing was performed under the following conditions after the film formation.

(Post Annealing Conditions)

Annealing temperature: 400° C.

Annealing time: 1 hour

Annealing atmosphere: atmospheric air

The mobility and the off-current were measured, and these are shown in the following Table 6.

TABLE 6

|  | Target input power (W) $In_2O_3:Ga_2O_3:ZnO$ | Second region In:Ga:Zn | q/(p + q) | Field-effect mobility (cm²/Vs) | Ioff (A) |
|---|---|---|---|---|---|
| Example 19 | 31.5:63.4:15.5 | 1:1:1 | 0.50 | 43.2 | 8.6E−10 |
| Example 20 | 19.3:70.0:14.5 | 0.5:1.5:1 | 0.75 | 44.3 | 8.7E−11 |
| Comparative Example 9 | 0:66.5:11.0 | 0:2:1 | 1.00 | 8.6E−2 | 5.1E−12 |

As shown in Table 6, even when annealing is performed at 400° C., the off-current is 1E−9A or less, as long as q/(p+q) >0.250.

Although the application of the thin film transistor according to the invention which has been described above is not particularly limited, the thin film transistor according to the invention is preferable as a driving element in, for example, a display device as an electro-optical device (such as a liquid crystal display device, an organic EL (Electro Luminescence) display device, or an inorganic EL display device).

Further, the thin film transistor according to the invention is preferably used as a driving element (driving circuit) in various electronic devices, for example, a device such as a flexible display which can be produced by a low temperature process using a resin substrate; various sensors such as an image sensor such as a CCD (Charge Coupled Device) or a CMOS (Complementary Metal Oxide Semiconductor), and an X-ray sensor; an MEMS (Micro Electro Mechanical System), and the like.

The disclosure of Japanese Patent Application No. 2011-177235 is incorporated in its entirety by reference in the present specification.

All the references, the patent applications and the technical standards described in the specification are incorporated by reference in the specification at the same extents as in the cases where the individual references, the individual patent applications and the individual technical standards are specifically and individually described.

The invention claimed is:

1. A thin film transistor comprising:

a gate electrode;

a gate insulating film which contacts the gate electrode;

an oxide semiconductor layer which includes a first region represented by In(a) Ga(b) Zn(c) O(d), wherein $0<a \leq 37/60$, $3a/7-3/14 \leq b \leq 91a/74-17/40$, $b>0$, $0<c \leq 3/5$, $a+b+c=1$, and $d>0$, and wherein a, b, and c correspond to a cation composition and d corresponds to a molar ratio of oxygen to cation composition to form oxide formed from zinc oxide, gallium oxie and zinc oxide, and a second region represented by In(p) Ga(q) Zn(r) O(s), wherein $q/(p+q)>0.250$, $p>0$, $q>0$, $r>0$, and $s>0$, and located farther than the first region with respect to the gate electrode, and which is arranged facing the gate electrode with the gate insulating film provided therebetween; and, a source electrode and a drain electrode which are arranged so as to be apart from each other and are capable of being electrically conducted through the oxide semiconductor layer.

2. The thin film transistor according to claim 1, wherein the first region is in a composition range represented by $b \leq 17a/23-28/115$, $b \leq -9a+28/5$, $b \geq 3a/7-3/14$, and $c \leq 3/5$.

3. The thin film transistor according to claim 1, wherein the first region is in a composition range represented by $b \leq 17a/23-28/115$, $b \leq -9a+28/5$, and $b \geq 3a/37$.

4. The thin film transistor according to claim 1, wherein the second region is represented by $q/(p+q) \leq 0.875$.

5. The thin film transistor according to claim 1, wherein a film thickness of the second region is more than 10 nm and less than 70 nm.

6. The thin film transistor according to claim 1, wherein the oxide semiconductor layer is amorphous.

7. The thin film transistor according to claim 1, wherein the thin film transistor is a bottom gate-top contact type or a top gate-bottom contact type.

8. A display device comprising the thin film transistor according to claim 1.

9. An image sensor comprising the thin film transistor according to claim 1.

10. An X-ray sensor comprising the thin film transistor according to claim 1.

11. An X-ray digital imaging device comprising the X-ray sensor according to claim 10.

12. The X-ray digital imaging device according to claim 11 capable of imaging a moving image.

13. The thin film transistor according to claim 1, wherein an off-current of the thin film transistor is $1 \times 10-9A$ or less.

14. The thin film transistor according to claim 1, wherein a field-effect mobility of the thin film transistor is 30 cm$^2$/Vs or more.

15. The thin film transistor according to claim 5, wherein the film thickness of the second region is 30 nm or more and less than 70 nm.

* * * * *